United States Patent
Clark et al.

(10) Patent No.: US 9,117,746 B1
(45) Date of Patent: Aug. 25, 2015

(54) PORTING A CIRCUIT DESIGN FROM A FIRST SEMICONDUCTOR PROCESS TO A SECOND SEMICONDUCTOR PROCESS

(71) Applicant: MIE Fujitsu Semiconductor Limited, Kuwana (JP)

(72) Inventors: Lawrence T. Clark, Phoenix, AZ (US); Scott E. Thompson, Gainesville, FL (US); Richard S. Roy, Dublin, CA (US); Samuel Leshner, Los Gatos, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/336,793

(22) Filed: Jul. 21, 2014

Related U.S. Application Data

(63) Continuation of application No. 14/171,224, filed on Feb. 3, 2014, now Pat. No. 8,806,395, which is a continuation of application No. 13/592,122, filed on Aug. 22, 2012, now Pat. No. 8,645,878.

(60) Provisional application No. 61/526,648, filed on Aug. 23, 2011.

(51) Int. Cl.
*G06F 17/50* (2006.01)
*H01L 21/22* (2006.01)
(Continued)

(52) U.S. Cl.
CPC .............. *H01L 21/22* (2013.01); *H01L 21/266* (2013.01); *H01L 29/7816* (2013.01)

(58) Field of Classification Search
CPC ....................................... G03F 1/144
USPC ............................... 716/51, 52, 54
See application file for complete search history.

(56) References Cited

U.S. PATENT DOCUMENTS

| 3,958,266 A | 5/1976 | Athanas |
| 4,000,504 A | 12/1976 | Berger |

(Continued)

FOREIGN PATENT DOCUMENTS

| EP | 0274278 | 7/1988 |
| EP | 0312237 | 4/1989 |

(Continued)

OTHER PUBLICATIONS

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24.

(Continued)

*Primary Examiner* — Suresh Memula
(74) *Attorney, Agent, or Firm* — Baker Botts L.L.P.

(57) ABSTRACT

Porting a first integrated circuit design targeted for implementation in a first semiconductor manufacturing process, and implementing a second circuit design in a second semiconductor manufacturing process wherein the electrical performance of the second integrated circuit meets or exceeds the requirements of the first integrated circuit design even if the threshold voltage targets of the second integrated circuit design are different from those of the first integrated circuit design; and wherein physical layouts, and in particular the gate-widths and gate-lengths of the transistors, of the first and second integrated circuit designs are the same or substantially the same. The second integrated circuit design, when fabricated in the second semiconductor manufacturing process and then operated, experiences less off-state transistor leakage current than does the first integrated circuit design, when fabricated in the first semiconductor manufacturing process, and then operated. Porting includes determining processing targets for the second semiconductor manufacturing process.

18 Claims, 22 Drawing Sheets

(51) Int. Cl.
*H01L 29/78* (2006.01)
*H01L 21/266* (2006.01)

(56) References Cited

U.S. PATENT DOCUMENTS

| | | | |
|---|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,330,526 B1 | 12/2001 | Yasuda |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,606,729 B2 | 8/2003 | Gross et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,698,000 B2 | 2/2004 | Tanaka |
| 6,730,568 B2 | 5/2004 | Sohn |
| 6,737,724 B2 | 5/2004 | Hieda et al. |
| 6,743,291 B2 | 6/2004 | Ang et al. |

(56) References Cited

U.S. PATENT DOCUMENTS

| | | |
|---|---|---|
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,795,800 B1 | 9/2004 | Lee |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,850,877 B1 | 2/2005 | Sengupta |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,901,570 B2 | 5/2005 | Lu |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |

(56) References Cited

U.S. PATENT DOCUMENTS

| | | |
|---|---|---|
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,937,252 B2 | 5/2011 | Onodera et al. |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,165,845 B1 | 4/2012 | Seebeck et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,204,714 B2 | 6/2012 | Lu |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,423,341 B2 | 4/2013 | Lu |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |

(56) References Cited

U.S. PATENT DOCUMENTS

| | | |
|---|---|---|
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0262414 A1 | 10/2010 | Joshi et al. |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0093242 A1 | 4/2011 | Lu |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2009/000934 | 12/2008 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4 (2001).

Ducroquet, F et al. "Fully Depleted Silicon-On-Insulator nMOSFETs with Tensile Strained High Carbon Content Sil-yCy Channel", ECS 210th Meeting, Abstract 1033 (2006).

Ernst, T et al., "Nanoscaled MOSEFT Transistors on Strained Si, SiGe, Ge Layers: Some Integration and Electrical Properties Features", ECS Trans. 2006, vol. 3, Issue 7, pp. 947-961 (2006).

Goesele, U et al., Diffusion Engineering by Carbon in Silicon, Mat. Res. Soc. Symp. vol. 610 (2000).

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113 (2008).

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4 (2009).

Holland, OW and Thomas, DK "A Method to Improve Activation of Implanted Dopants in SiC", Oak Ridge National Laboratroy, Oak Ridge, TN (2001).

Komaragiri, R. et al., "Depletion-Free Poly Gate Electrode Architecture for Sub 100 Nanometer CMOS Devices with High-K Gate Dielectrics," *IEEE IEDM Tech Dig.*, San Francisco CA, 833-836, Dec. 13-15, 2004.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Duel Gate CMOS", IEDM 96, pp. 459-462 (1996).

Lavéant, P. "Incorporation, Diffusion and Agglomeration of Carbon in Silicon", Solid State Phenomena, vols. 82-84, pp. 189-194 (2002).

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814 (Apr. 1998).

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383 (Jul. 1999).

Pinacho, R et al., "Carbon in Silicon: Modeling of Diffusion and Clustering Mechanisms", Journal of Applied Physics, vol. 92, No. 3, pp. 1582-1588 (Aug. 2002).

Robertson, LS et al., "The Effect of Impurities on Diffusion and Activation of Ion Implanted Boron in Silicon", Mat. Res. Soc. Symp. vol. 610 (2000).

Scholz, R et al., "Carbon-Induced Undersaturation of Silicon Self-Interstitials", Appl. Phys. Lett. 72(2), pp. 200-202 (Jan. 1998).

Scholz, RF et al., "The Contribution of Vacancies to Carbon Out-Diffusion in Silicon", Appl. Phys. Lett., vol. 74, No. 3, pp. 392-394 (Jan. 1999).

Stolk, PA et al., "Physical Mechanisms of Transient Enhanced Dopant Diffusion in Ion-Implanted Silicon", J. Appl. Phys. 81(9), pp. 6031-6050 (May 1997).

Thompson, S et al., "MOS Scaling: Transistor Challenges for the 21st Century", Intel Technology Journal Q3' 1998, pp. 1-19 (1998).

Wann, C. et al., "Channel Profile Optimization and Device Design for Low-Power High-Performance Dynamic-Threshold MOSFET", IEDM 96, pp. 113-116 (1996).

Werner, P et al., "Carbon Diffusion in Silicon", Applied Physics Letters, vol. 73, No. 17, pp. 2465-2467 (Oct. 1998).

NPL22 Yan, Ran-Hong et al., "Scaling the Si MOSFET: From Bulk to SOI to Bulk", IEEE Transactions on Electron Devices, vol. 39, No. 7 (Jul. 1992).

Banerjee, et al. "Compensating Non-Optical Effects using Electrically-Driven Optical Proximity Correction", Proc. of SPIE vol. 7275 72750E (2009).

Cheng, et al. "Extremely Thin SOI (ETSOI) CMOS with Record Low Variability for Low Power System-on-Chip Applications", Electron Devices Meeting (IEDM) (Dec. 2009).

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213 (2009).

Drennan, et al. "Implications of Proximity Effects for Analog Design", Custom Integrated Circuits Conference, pp. 169-176 (Sep. 2006).

(56) References Cited

OTHER PUBLICATIONS

Hook, et al. "Lateral Ion Implant Straggle and Mask Proximity Effect", IEEE Transactions on Electron Devices, vol. 50, No. 9, pp. 1946-1951 (Sep. 2003).

Hori, et al.. "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911 (Dec. 1993).

Matshuashi, et al. "High-Performance Double-Layer Epitaxial-Channel PMOSFET Compatible with a Single Gate CMOSFET", Symposium on VLSI Technology Digest of Technical Papers, pp. 36-37 (1996).

Shao, et al,. "Boron Diffusion in Silicon: The Anomalies and Control by Point Defect Engineering", Materials Science and Engineering R: Reports, vol. 42, No. 3-4, pp. 65-114, Nov. 1, 2003.

Shell et al. "Modeling the Well-Edge Proximity Effect in Highly Scaled MOSFETs", IEEE Transactions on Electron Devices, vol. 53, No. 11, pp. 2792-2798 (Nov. 2006).

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93 (2006).

Wong, H et al., "Nanoscale CMOS", Proceedings of the IEEE, Vo. 87, No. 4, pp. 537-570 (Apr. 1999).

PORTING A CIRCUIT DESIGN FROM A FIRST SEMICONDUCTOR PROCESS TO A SECOND SEMICONDUCTOR PROCESS

CROSS-REFERENCE TO RELATED APPLICATIONS

This is a continuation of non-provisional application Ser. No. 14/171,224, entitled "Porting A Circuit Design From A First Semiconductor Process To A Second Semiconductor Process," filed 3 Feb. 2014, which is a continuation of non-provisional application Ser. No. 13/592,122, entitled "Porting A Circuit Design From A First Semiconductor Process To A Second Semiconductor Process," filed 22 Aug. 2012, which claims the benefit of U.S. Provisional Application 61/526,648, entitled, "Integrated Circuit Devices and Methods," and filed 23 Aug. 2011, the entirety of each is hereby incorporated by reference.

INCORPORATION BY REFERENCE OF ADDITIONAL DOCUMENTS

In addition to provisional application referred to above, the following are incorporated herein by reference: U.S. patent application Ser. No. 12/895,785 filed 30 Sep. 2010, titled "Advanced Transistors With Threshold Voltage Set Dopant Structures;" U.S. patent application Ser. No. 12/960,266, filed 3 Dec. 2010; U.S. patent application Ser. No. 13/471,353 filed 14 May 2012, titled "Integrated Circuit Devices and Methods;" U.S. patent application Ser. No. 13/459,971 filed 30 Apr. 2012, titled "Multiple Transistor Types Formed in a Common Epitaxial Layer by Differential Out-Diffusion from a Doped Underlayer;" U.S. patent application Ser. No. 12/708,497, filed 18 Feb. 2010, titled "Electronic Devices And Systems, And Methods For Making And Using The Same;" U.S. patent application Ser. No. 12/971,884, filed 17 Dec. 2010, titled "Low Power Semiconductor Transistor Structure and Method of Fabrication Thereof;" U.S. patent application Ser. No. 12/971,955, filed 17 Dec. 2010, titled "Transistor with Threshold Voltage Set Notch and Method of Fabrication Thereof."

FIELD OF THE INVENTION

The present invention relates generally to integrated circuits and methods of reusing circuits designed for one semiconductor manufacturing process in a second semiconductor manufacturing process where that second semiconductor manufacturing process provides lower subthreshold leakage currents and lowers intra-die and inter-die variability of threshold voltage.

BACKGROUND

Integrated circuit design typically begins with the knowledge of a design goal or specification. Such specifications describe the required performance of the circuit(s) to be designed. Integrated circuit designers typically first create a computer model of a circuit design that will meet the performance specification. That circuit design model is based upon the electrical circuit elements that are available in a given semiconductor manufacturing process. For example, electrical circuit elements may include diodes, transistors, capacitors, resistors, and so on. Typical modern integrated circuits include both p-channel and n-channel field effect transistors.

As is known in the field of integrated circuit design, the cost of preparing masks and fabricating the integrated circuits is very high. In view of these costs, integrated circuit designers perform extensive simulations of their circuit designs in order to reduce the risk of manufacturing a circuit that does not perform as desired. Such circuit simulations generally rely on four sets of information: (a) a network topology description, (b) circuit element models, (c) process related targets (e.g., transistor threshold voltages), and (d) input waveforms to drive the circuit being simulated.

Both the network topology description and the input waveforms are independent of, or at least substantially decoupled from, the semiconductor manufacturing process with which the circuit is intended to be manufactured. The circuit element models and the process related targets are closely related to this semiconductor manufacturing process.

It is common for integrated circuit designers to seek to reduce the static power consumed by integrated circuits. It is common in semiconductor process technology nodes from about 45 nm and beyond, that a substantial amount of static power is attributable to off-state leakage current in transistors. However, even in seeking to reduce the power consumption due to leakage current, designers also seek to re-use their circuit designs (both transistor network topologies and physical layout).

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

Figure 1A:
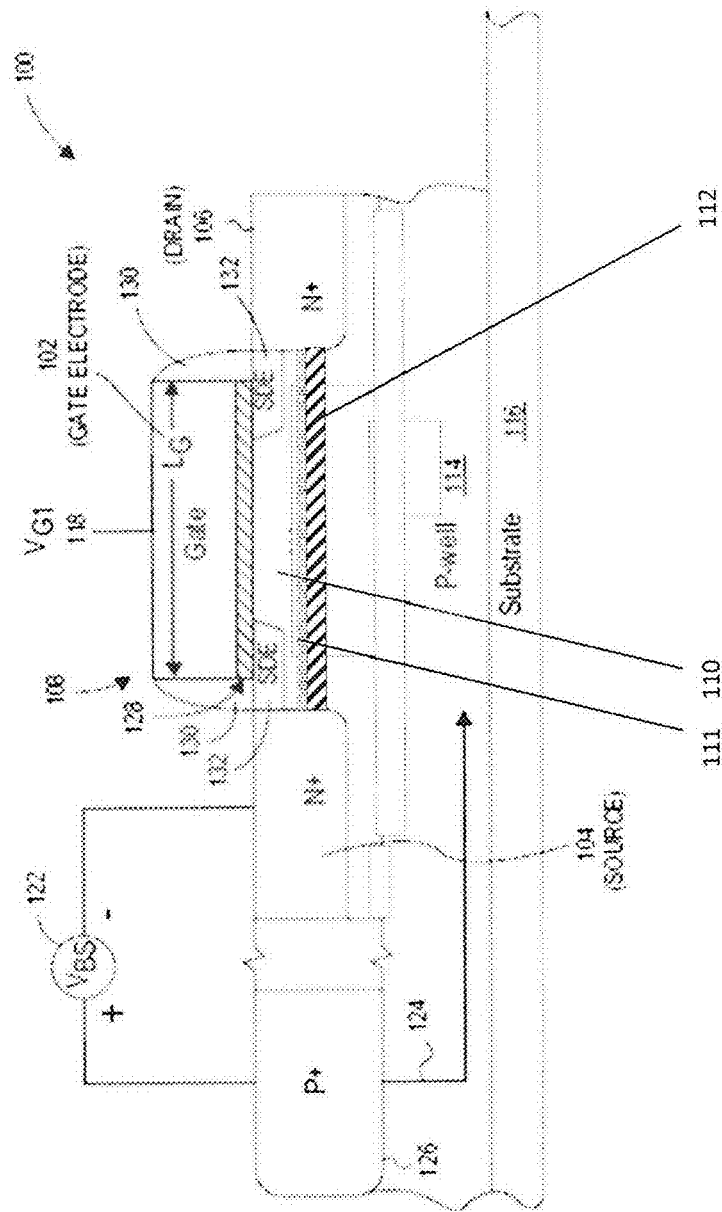
FIG. 1A is a cross-sectional view of an n-channel field effect transistor fabricated in accordance with the Deeply Depleted Channel (DDC) transistor architecture.

It is noted that the cross-sectional representations of various semiconductor structures shown in the figures are not necessarily drawn to scale, but rather, as is the practice in this field, drawn to promote a clear understanding of the structures, process steps, and operations which they are illustrating.

DETAILED DESCRIPTION

The following Detailed Description refers to accompanying drawings to illustrate exemplary embodiments consistent with the invention. References in the Detailed Description to "one exemplary embodiment," "an illustrative embodiment," "an exemplary embodiment," and so on, indicate that the exemplary embodiment described may include a particular feature, structure, or characteristic, but every exemplary or illustrative embodiment may not necessarily include that particular feature, structure, or characteristic. Moreover, such phrases are not necessarily referring to the same exemplary embodiment. Further, when a particular feature, structure, or characteristic is described in connection with an embodiment, it is within the knowledge of those skilled in the relevant art(s) to affect such feature, structure, or characteristic in connection with other embodiments whether or not explicitly described.

The following Detailed Description of the exemplary embodiments will so fully reveal the general nature of the embodiments that others can, by applying knowledge of those skilled in relevant art(s), readily modify and/or adapt for various applications such exemplary embodiments, without undue experimentation. Therefore, such adaptations and modifications are intended to be within the meaning and plurality of equivalents of the exemplary embodiments.

The acronym AVT, as used herein is interchangeable with $\sigma V_T$.

The acronym CMOS refers to Complementary Metal Oxide Semiconductor. As used in this disclosure CMOS refers to either a circuit that includes both p-channel field effect transistors and n-channel field effect transistors, or a semiconductor manufacturing process that produces both p-channel field effect transistors and n-channel field effect transistors on the same die or on the same substrate.

Epitaxial layer refers to a layer of single crystal semiconductor material. In this field, an epitaxial layer is commonly referred to "epi."

FET, as used herein, refers to field effect transistor. An n-channel FET is referred to herein as an N-FET. A p-channel FET is referred to herein as a P-FET. Unless noted otherwise the FETs referred to herein are MOSFETs.

It is noted that the use of the word "transistor" in this field is context sensitive. That is, depending on the context, it may refer to a physically implemented transistor in an integrated circuit, a simulation model of a transistor, a layout of a transistor, a schematic representation of a transistor, and so on.

As used herein, "gate" refers to the gate terminal of a FET. The gate terminal of a FET is also referred to in this field as a "gate electrode." Historically, the gate electrode was a single structure such as a layer of doped polysilicon disposed on a gate dielectric. More recent gate electrodes have included the use of metals and metal alloys in their structures.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece that is transformed by various process operations into the desired microelectronic configuration. Silicon wafers are a commonly used substrate in the manufacture of integrated circuits.

The "active" surface of a substrate refers to the surface in and upon which active circuit elements such as transistors are, or are to be, formed.

The acronym SRAM refers to Static Random Access Memory.

The term "porting" as used herein refers to the methods involved in taking a first integrated circuit design that has been targeted for implementation in a first semiconductor manufacturing process, and implementing a second circuit design in a second semiconductor manufacturing process wherein the electrical performance of the second integrated circuit meets or exceeds the requirements specified for the first integrated circuit design even if the threshold voltage targets of the second integrated circuit design are different from those of the first integrated circuit design; and wherein physical layouts, and in particular the gate-widths and gate-lengths of the transistors, of the first and second integrated circuit designs are the same or substantially the same. Further, in the context of the present disclosure, the second integrated circuit design, when fabricated in the second semiconductor manufacturing process and then operated, experiences less off-state transistor leakage current than does the first integrated circuit design, when fabricated in the first semiconductor manufacturing process, and then operated. Still further, in the context of the present disclosure, the methods involved in porting include determining processing targets for the second semiconductor manufacturing process.

The term "migrating" as used herein is synonymous with porting.

Overview

It is well known in the fields of integrated circuit design and semiconductor manufacturing that each new technology node provides smaller feature sizes for transistors, and usually for other structures such as interconnect as well. Conventionally, improved electrical performance required implementing integrated circuit designs with a more advanced manufacturing processes at a technology node that offered smaller feature sizes. Historically it was possible to "shrink" the physical layout and manufacture this smaller version of the original design in the new process. However, as feature sizes have become smaller, and particularly as minimum transistor dimensions have decreased below 100 nm, the required manufacturing processes and lithography methods have introduced layout constraints to such an extent that a simple linear shrink of a physical layout is very difficult, if not impossible, to use as a means of migrating a given integrated circuit design from a first process to a second process that offers improved electrical performance.

As noted above, integrated circuit designers seek to reduce static power consumption due to off-state leakage current. But, even in seeking to reduce this parasitic power consumption, circuit designers also desire to re-use their integrated circuit designs. In this context, an integrated circuit design refers to the information describing both a transistor network topology and a corresponding physical layout. It is noted that the aforementioned "transistor network topology" is used broadly herein and may encompass circuit network topologies that include other electrical circuit elements such as resistors, capacitors, diodes, and so on.

In general, a digital integrated circuit design project progresses through a number of well recognized steps. Each step provides some work product that is typically used as an input to the next step. For example, a system level description or system specification may be prepared that describes the functions and features of an integrated circuit. From the system level specification an architectural design for the proposed integrated circuit may be prepared. Next, a functional design and/or logic design is performed. Transistor-level circuit design may be performed subsequent to a logic design. Physical design may involve creating a physical layout of the integrated circuit, or at least portions of the integrated circuit. Various verification processes are performed to ensure that the design will meet its performance specifications. In the case of a digital integrated circuit, for example, simulations and/or static timing analyses are used to ensure that the timing requirements are met; design rule checking is performed to ensure manufacturability of the physical layout; layout versus schematic checking is performed to ensure that the physical layout matches the intended circuit design; and so on. Finally the integrated circuit is fabricated, tested, packaged, and the process is complete.

It is noted that there may be wide latitude in the steps of the circuit design project outlined above. For example, if the integrated circuit design is to be created by using pre-designed standard cells, then the need to perform transistor-level circuit design may be significantly diminished if not eliminated.

Recently, processes have been developed, such as the DDC transistor manufacturing process developed by SuVolta, Inc., of Los Gatos, Calif., which can improve electrical performance and yield without requiring an integrated circuit design to be re-implemented at the smaller dimensions required at other technology nodes. Because electrical and yield improvements can be obtained without having to re-design circuitry and physical layouts for smaller feature sizes, there is significant interest in porting existing integrated circuit designs from a first semiconductor manufacturing process to a second manufacturing process with no, or relatively few, changes to the physical layout.

Various embodiments provide for transforming transistor parameter targets of a circuit designed for a first semiconductor manufacturing process to transistor parameter targets in a second semiconductor manufacturing process. The transistor parameter targets for the second process provide equal or better electrical performance and/or equal or better yield when the circuit is manufactured using the second process. The transistor parameter targets of the second process are typically, but not necessarily, different from those of the first process.

By way of example and not limitation, FET threshold voltage is a commonly used transistor parameter target. In fact, many semiconductor processes are set up to provide N-FETs selectively targeted to have either low Vt, standard Vt, or high Vt. Such processes also typically provide P-FETs selectively targeted to have either low Vt, standard Vt, or high Vt.

In the case of memory bit cell design, a substantial effort goes into developing and verifying the physical layout of the bit cell. From both cost and time-to-market perspectives, it would be very helpful in the case of a memory bit cell design to be able to port an existing design to a process with improved electrical characteristics. Improvements in electrical characteristics that are particularly desirable are reduced leakage current, and reduced inter- and intra-die variability in FET threshold voltages.

The DDC transistor architecture, and the semiconductor manufacturing process that produces it, have these sought after characteristics of low sub-threshold conduction, and low intra- and inter-die variability in threshold voltage. This architecture and process are discussed in more detail below.

Since the DDC transistor architecture and manufacturing process provide designers with the electrical characteristics that are desired, but designers are reluctant to invest in a re-design and re-layout of an existing circuit, a means of facilitating the porting of existing circuit designs to the DDC process would benefit designers, producers and consumers alike.

DDC Transistor Architecture and Manufacturing Process

The structural architecture and illustrative methods of manufacturing DDC transistors are disclosed in great detail in various patents and patent applications assigned to the assignee of this application. Nonetheless, a short description of the DDC structural architecture, methods of manufacturing, and electrical characteristics are provided below.

FIG. 1A shows an embodiment of an Deeply Depleted Channel (DDC) transistor 100 that is formed on a P-type silicon substrate and configured to have an enhanced body coefficient, along with the ability to set threshold voltage Vt with enhanced precision. DDC transistor 100 is an N-FET and includes a gate electrode 102, a first N-type source/drain (S/D) 104, a second N-type S/D 106, and a gate dielectric layer 128 disposed over a substantially undoped channel region 110. Lightly doped source/drain extensions (SDE) 132, are disposed, respectively, adjacent to first and second source/drain 104, 106, and extend toward each other thus reducing the effective length of channel region 110.

DDC transistor 100 includes a screening region 112 that is highly doped with P-type dopants, and a Vt set region 111 also including P-type dopants. It will be understood that, with appropriate change to substrate or dopant material, a P-FET DDC transistor can similarly be formed.

In one embodiment, a process for forming the DDC transistor includes forming the screening region 112. In some embodiments, the screening region is formed by implanting dopants into P-well 114. In alternative embodiments the screening region is formed on the P-well using methods such as in-situ doped epitaxial silicon deposition, or epitaxial silicon deposition followed by dopant implantation. The screening region formation step can be before or after shallow trench isolation (STI) formation, depending on the application and results desired. Boron (B), Indium (I), or other P-type materials may be used for P-type implants, and arsenic (As), antimony (Sb) or phosphorous (P) and other N-type materials can be used for N-type implants. In some embodiments, screening region 112 can have a dopant concentration between about $1 \times 10^{18}$ to $1 \times 10^{20}$ dopant atoms/cm$^3$, with approximately $5 \times 10^{19}$ being typical. A germanium (Ge), carbon (C), or other dopant migration resistant layer can be applied above the screening region to reduce upward migration of dopants. The dopant migration resistant layer can be implanted into the screening region or provided as an in-situ doped epitaxial layer.

Figure 12:
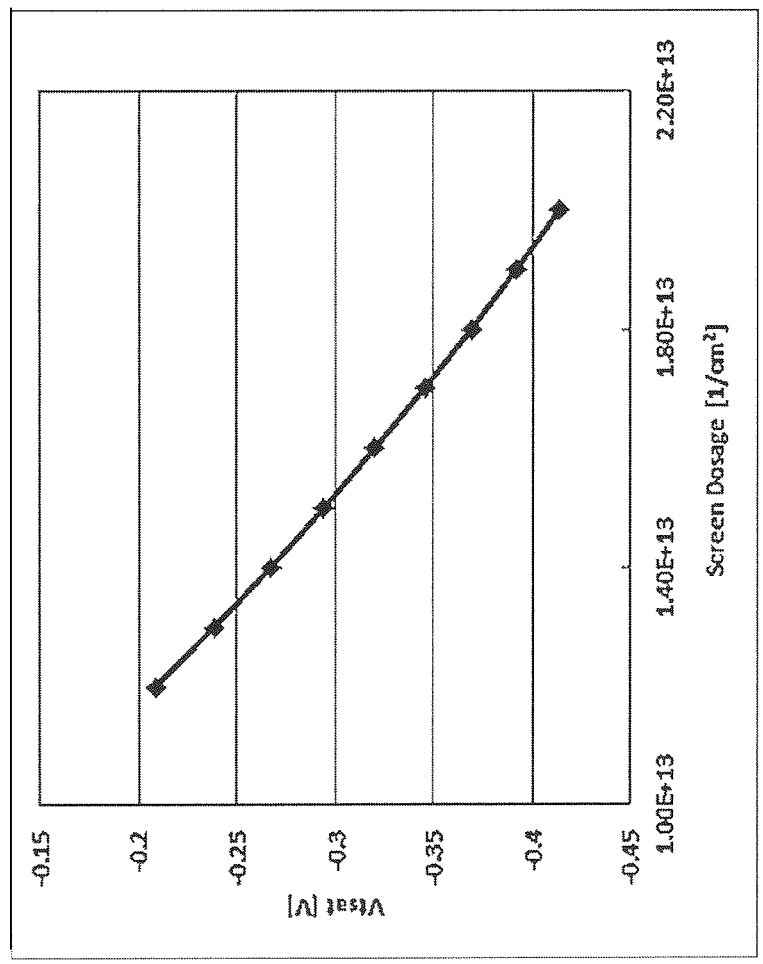
FIG. 12 is an illustrative plot showing transistor threshold voltage as a function of doping concentration in the screen region of a DDC transistor.

In some embodiments, a threshold voltage (Vt) set region 111 is disposed above screening region 112, and formed as a thin doped layer. Vt set region 111 can be either adjacent to screening region 112, be within screening region 112 or vertically offset from screening region 112. In some embodiments, Vt set region 111 is formed by delta doping, controlled in-situ deposition, or atomic layer deposition. Vt set region 111 can alternatively be formed by way of an in-situ doped epitaxial layer that is grown above screening region 112, or by epitaxial growth of a thin layer of silicon followed by out-diffusion of dopant atoms from screening region 112. Varying dopant concentration, allows for adjustments to the threshold voltage value for the transistor. In some embodiments, Vt set region 111 can have a dopant concentration between about $1 \times 10^{18}$ dopant atoms/cm$^3$ and about $1 \times 10^{19}$ dopant atoms per cm$^3$. In alternative embodiments, Vt set region 111 can have a dopant concentration that is approximately less than half of the concentration of dopants in screening region 112. An example of the relationship between threshold voltage and dopant concentration is provided at FIG. 12. FIG. 12 shows that with a higher dose of dopant material, a greater absolute value of threshold voltage is obtained in the physically implemented transistor. In this illustrative example, ion implantation performed to introduce the dopant material into a substrate.

In some embodiments, the formation of Vt set region 111 is followed by a non-selective blanket epi deposition step that forms the substantially undoped channel region 110. Shallow trench isolation (STI) structures can be formed after the non-selective blanket epi deposition step, and can include the formation of a low temperature trench sacrificial oxide liner, at a temperature lower than 900° C.

In addition to using dopant migration resistant layers, other techniques can be used to reduce upward migration of dopants from screening region 112 and Vt set region 111, including but not limited to low temperature processing, selection or substitution of low migration dopants such as antimony or indium, low temperature or flash annealing to reduce interstitial dopant migration, or any other technique to reduce movement of dopant atoms.

Substantially undoped channel region 110 is positioned above Vt set region 111. Preferably, substantially undoped channel region 110 is achieved by way of epitaxial growth of intrinsic semiconductor material without dopant additives to modify the electrical conductivity of the material. The resultant layer typically has a dopant concentration less than $5 \times 10^{17}$ dopant atoms per cm$^3$. In alternative embodiments, substantially undoped channel region 110 has a dopant concentration that is approximately less than one tenth of the dopant concentration in screening region 112. In one embodiment, the thickness of substantially undoped channel region 110 can range from 5 to 50 nanometers, with exact thickness being dependent on desired transistor operating characteristics and transistor design node (i.e., a 20 nm gate length transistor will typically have a thinner channel thickness than a 45 nm gate length transistor).

A gate stack may be formed or otherwise constructed above channel region 110 in a number of different ways, from different materials, and of different work functions as is known in this field.

Source 104 and drain 106 can be formed preferably using conventional dopant ion implantation processes and materials, and typically includes source/drain extension regions that define, at least in part, the electrical channel length of the transistor of which they form a part. Channel region 110 contacts and extends between S/D 104 and S/D 106.

In various embodiments of DDC transistor 100, when voltage is applied at gate electrode at a predetermined level, a depletion region formed in channel region 110 can substantially extend to screening region 112.

Overall improvement of noise and electrical characteristics for a transistor require careful trade-offs to be made in doping density, length, and depth of the foregoing transistor structures. Improvements made in one area, for example, channel mobility, can be easily offset by adverse short channel effects or greater variability in capacitance or output resistance. One particularly critical parameter for analog and digital transistor design is the threshold voltage at which the transistor switches on or off.

The threshold voltage of DDC transistor 100 can be adjusted by controlling the dopant concentration and position of Vt set region 111, while leaving the bulk of channel region 110 substantially undoped. In a typical DDC process architecture, conventional "channel implants" where the channel is implanted to set threshold voltage, is not used. Preferably, the threshold voltage setting technique of forming halos adjacent to the source/drain is not used, either. Preferably, the threshold voltage of the DDC transistor is set by the design, or selection, of various DDC process variables such as the doping depth, doping profile of the doped region and location and value of the peak concentration to result in a laterally extended, doped region that is embedded a distance away from the gate dielectric layer, preferably separated from the gate dielectric by a distance of at least ⅕ of the gate length (Lg). The DDC transistor doping profiles and dopant concentrations are designed, or selected, to achieve the desired threshold voltage, junction leakage and other parametric values. The design, or selection of the doping profiles and concentrations typical takes into consideration factors such as, but not limited to, the work function of the gate electrode.

As previously noted, screening region 112 is a highly doped layer that typically contains dopant atoms with a concentration of between $1 \times 10^{18}$ atoms/cm$^3$ and $1 \times 10^{20}$ atoms/cm$^3$, positioned under channel region 110. P-type dopants such as boron are selected for screening regions of N-FETs, while N-type dopants such as arsenic, antimony or phosphorus can be selected for P-FETs. The presence of a screening region below channel region 110 is necessary to define a depletion zone beneath the gate. Generally, the greater the distance screening region 112 is positioned from gate dielectric 128, the lower the threshold voltage, and conversely, the closer screening region 112 is to gate dielectric 128, the higher the threshold voltage. As shown in FIGS. 1-2, screening region 112 can contact S/D regions, or optionally, it can be positioned at a greater distance below the gate to avoid direct contact with the S/D regions (not shown). In some embodiments, it may be formed as a blanket or sheet extending under multiple source/drain/channel regions, while in other embodiments it may be a self-aligned implant or layer coextensive with channel region 110 or a layer extending between outer edges of gate spacers 130. The screening region thickness can typically range from 5 to 100 nanometers. Screening region 112 is highly doped relative to channel region 110, the threshold voltage set region (if provided), and the well region. The peak dopant concentration of the screening region can be ten times or greater than the dopant concentration of the substantially undoped channel, with a relative concentration that can be between ten to a hundred times the dopant concentration of channel region 110. In practice, screening region 112 can be doped to have a near uniform concentration of between $5\times10^{18}$ atoms/cm$^3$ and $5\times10^{19}$ atoms/cm$^3$. However, embodiments in which the screening region has complex dopant profile or reduces sharply in concentration from an initial spike are also contemplated. In certain embodiments, dopant migration resistant layers of carbon, germanium, or the like can be applied along with or above screening region to prevent dopant migration into the optional Vt set region and the channel region.

A DDC semiconductor fabrication process typically uses a different process sequence from the conventional CMOS semiconductor fabrication process because it is imperative to control against unwanted migration of dopants from the screen/Vt set region into the channel which must remain substantially undoped. An exemplary process flow for a DDC semiconductor fabrication process is shown in FIG. 1B.

Figure 1B:
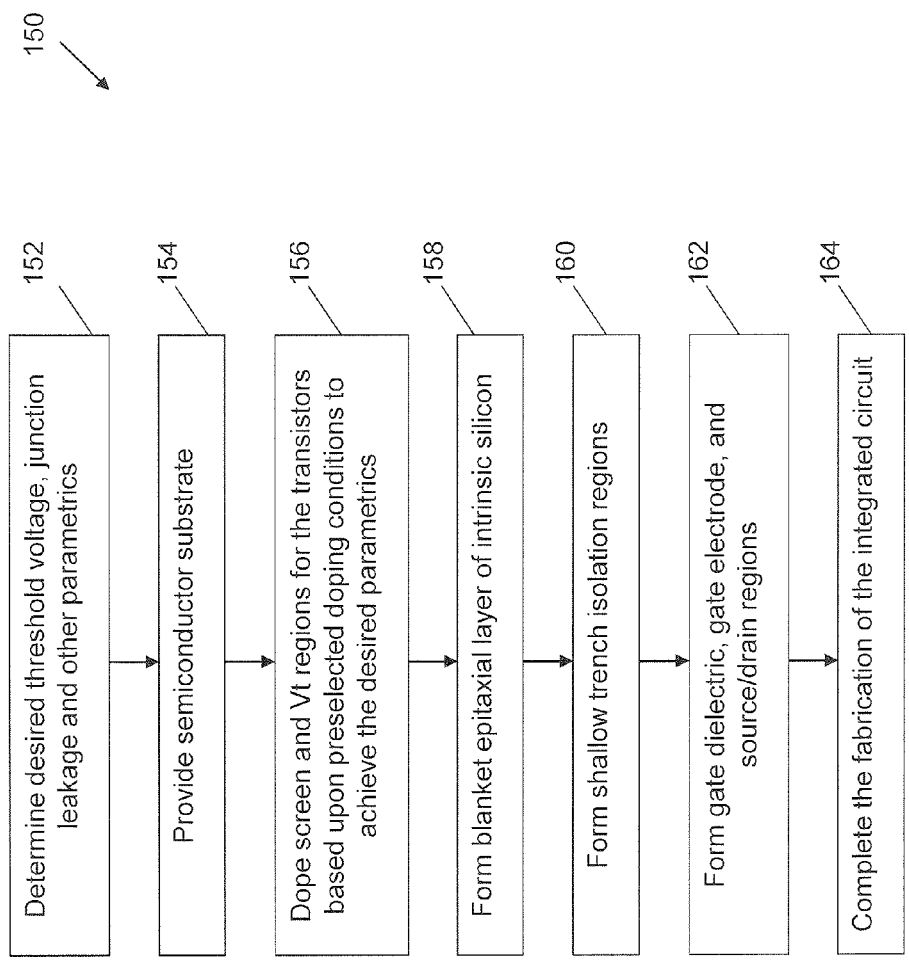
FIG. 1B is a flow diagram of an illustrative process for fabricating a DDC transistor.
Figure 2:
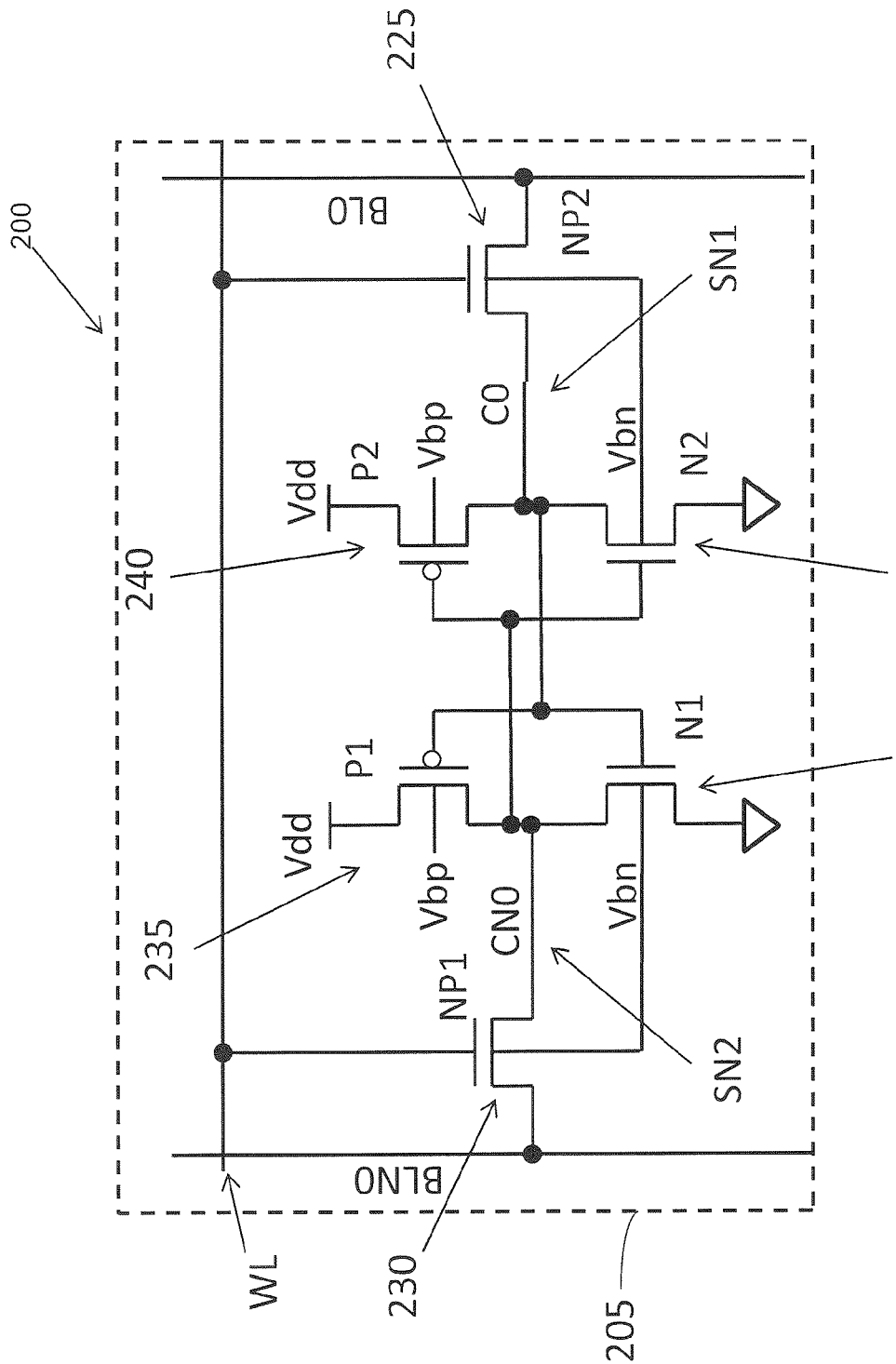
FIG. 2 is a schematic diagram of a static memory bit cell, where the bit cell includes a pair of cross-coupled CMOS inverters.

Referring to FIG. 1B, an illustrative process 150 for fabricating integrated circuits that include one or more DDC transistors is shown. In a step 152, the desired transistor threshold voltage, junction leakage, and other transistor parametrics are determined. In a step 154, a semiconductor wafer is provided. In this illustrative embodiment, the semiconductor substrate is a bulk silicon wafer. In a step 156, doping operations are performed to dope the screen region and the Vt set region of each DDC transistor. The doping profiles, concentrations, and dopant conductivity types are preselected based, at least in part, on the doping conditions needed to achieve the desired parametrics. It is noted that there may be more than one set of doping profiles, concentrations, and dopant conductivity types that can produce the desired set electrical characteristics in a fabricated DDC transistor. In a step 158, a blanket epitaxial layer is formed on the active-side surface of the substrate. In this illustrative embodiment, the epitaxial layer is an intrinsic silicon. In a step 160, shallow trench isolation regions are formed on the active-side surface of the substrate. In a step 162, a gate dielectric layer and a gate electrode layer are formed and patterned; and S/D regions are formed in the substrate adjacent to the patterned gate electrodes. It is noted that the gate dielectric layer may be a stack that includes two or more materials. It is further noted that the gate electrode may be formed of a single layer of material or may be formed of a stack of materials. It is still further noted that the gate electrode may be removed and replaced subsequent to the formation of the S/D regions. In a step 164, the fabrication of integrated circuits is completed. As will be appreciated by those skilled in the art and having the benefit of this disclosure, various conventional processing operations, including but not limited to forming and patterning interconnect layers and vias may be performed to complete the integrated circuits.

It is noted that the DDC semiconductor fabrication process can be adapted to fabricate a combination of DDC transistors and non-DDC transistors. For instance, if non-DDC transistors of conventional planar type are to be fabricated, then the process described above in connection with FIG. 1B can be modified to accommodate the fabrication steps for conventional planar type transistors.

Figure 1C:
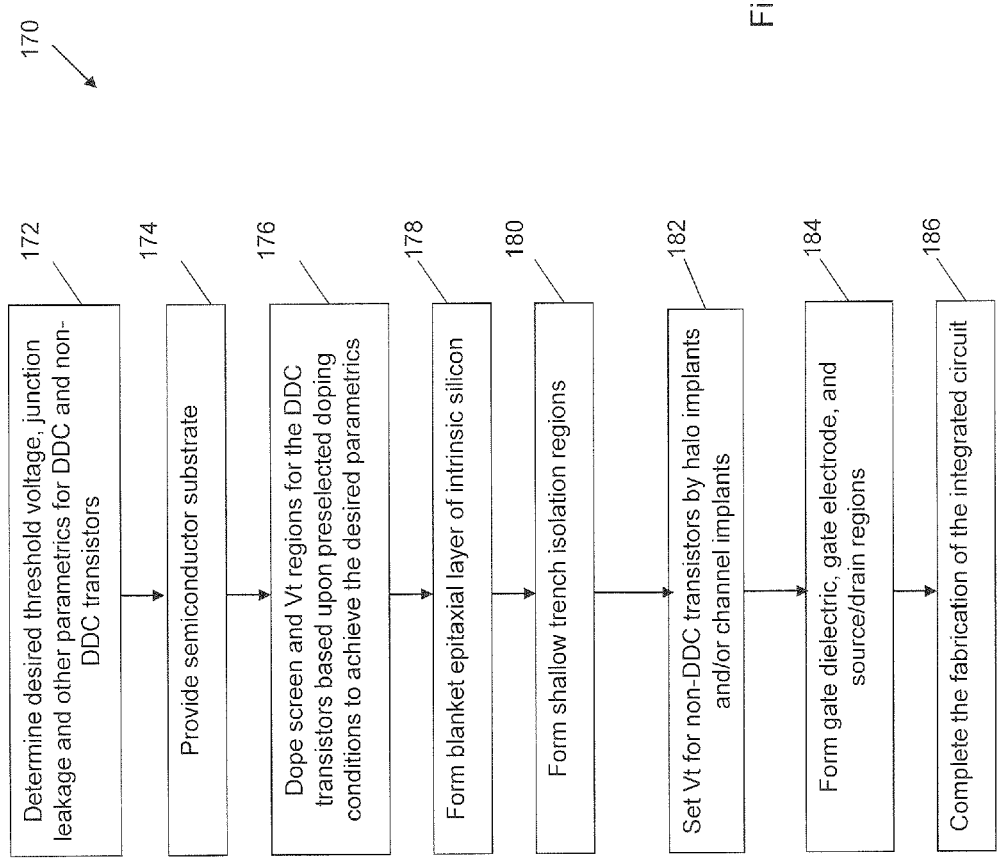
FIG. 1C is a flow diagram of an illustrative process for fabricating DDC and non-DDC transistors.

Referring to FIG. 1C, an illustrative process 170 for fabricating integrated circuits that include one or more DDC transistors together with one or more non-DDC transistor is shown. In a step 172, the desired transistor threshold voltage, junction leakage, and other transistor parametrics for DDC and non-DDC transistors are determined. In a step 174, a semiconductor wafer is provided. In this illustrative embodiment, the semiconductor substrate is a bulk silicon wafer. In a step 176, doping operations are performed to dope the screen region and the Vt set region of each DDC transistor. The doping profiles, concentrations, and dopant conductivity types are preselected based, at least in part, on the doping conditions needed to achieve the desired parametrics. It is noted that there may be more than one set of doping profiles, concentrations, and dopant conductivity types that can produce the desired set electrical characteristics in a fabricated DDC transistor. In a step 178, a blanket epitaxial layer is formed on the active-side surface of the substrate. In this illustrative embodiment, the epitaxial layer is an intrinsic silicon. In a step 180, shallow trench isolation regions are formed on the active-side surface of the substrate. In a step 182, the threshold voltages for non-DDC transistors are set by halo and/or channel implants. In a step 184, a gate dielectric layer and a gate electrode layer are formed and patterned; and S/D regions are formed in the substrate adjacent to the patterned gate electrodes. It is noted that the gate dielectric layer may be a stack that includes two or more materials. It is further noted that the gate electrode may be formed of a single layer of material or may be formed of a stack of materials. It is still further noted that the gate electrode may be removed and replaced subsequent to the formation of the S/D regions. In a step 186, the fabrication of integrated circuits is completed. As will be appreciated by those skilled in the art and having the benefit of this disclosure, various conventional processing operations, including but not limited to forming and patterning interconnect layers and vias may be performed to complete the integrated circuits.

It is noted that applying bias to screening region 112 is another technique for modifying Vt of DDC 100. Screening region 112 sets the body effect for the transistor and allows for a higher body effect than is found in conventional FET technologies. For example, a body tap 126 to screening region 112 of DDC transistor 100 can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements.

SRAM Bit Cells

Referring to FIG. 2, a portion of a typical SRAM 200 is shown. Typical SRAMs include a plurality of SRAM bit cells (hereinafter "bit cells"). In an SRAM, bit cells are typically arranged in rows and columns. FIG. 2 shows a bit cell 205. Bit cell 205 is implemented using DDC transistors.

Bit cell 205 includes a pair of access transistors 225, 230, and a pair of cross-coupled CMOS inverters. A first inverter of bit cell 205 includes P-FET 235 and N-FET 245. P-FET 235 is coupled source-to-drain between a power supply node Vdd and an output node CN0 of the first inverter. N-FET 245 is coupled drain-to-source between node CN0 and ground. A second inverter of bit cell 205 includes P-FET 240 and N-FET 250. P-FET 240 is coupled source-to-drain between a power supply node Vdd and an output node C0 of the second inverter. N-FET 250 is coupled drain-to-source between node C0 and ground. Since the CMOS inverters are cross-coupled, the gates of P-FET 235 and N-FET 245 (the first inverter) are electrically connected to each other and to output node C0. Access transistor 225 couples node C0 to a first bit line BL0, and access transistor 230 couples node CN0 to a second bit line BLN0. The respective body terminals of N-FETs 225, 230, 245, 250 are coupled to a node labeled Vbn. Node Vbn may be the ground node of the circuit, or may be the output node of a voltage source that provides a fixed bias voltage, or may be the output node of a voltage source that provides a dynamically variable bias voltage. The respective body terminals of P-FETs 235, 240 are coupled to a node labeled Vbp. In some embodiments node Vbp is coupled to Vdd.

Bit cell 205 can retain its state indefinitely as long as the power supply voltage Vdd is sufficient to operate the cell correctly, i.e., exceeds $V_{DDmin}$. Bit cell 205 includes two cross-coupled inverters consisting of the pair of transistors 235 and 245, and 240 and 250. The two inverters operate to reinforce the stored charge on storage nodes CN0 and C0 continuously, such that the voltages at each of the two storage nodes are inverted with respect to one another. When CN0 is at a logical "1", usually a high voltage, C0 is at a logical "0", usually a low voltage, and vice versa. As long as the small-signal loop gain is greater than 1, the stored voltages are reinforced and the storage is successful.

Still referring to FIG. 2, a write operation can be performed to store data in bit cell 205, and a read operation can be performed to access stored data in bit cell 205. In one embodiment, data is stored in bit cell 205, during a write operation by placing complementary write data signals on the two bit lines BL0 and BLN0, and placing a positive voltage $V_{WL}$ on the word line WL connected to the gates of access transistors 225 and 230, such that the two bits lines are coupled to the storage nodes C0 and CN0 respectively. The write operation is successful when the write data signals on the two bit lines overcome the voltages on the two storage nodes and modify the state of the bit cell. The cell write is primarily due to the bit line driven low overpowering the P-FET pull-up transistor via the access transistor. Thus the relative strength ratio of the N-FET access transistor to the P-FET pull-up transistor is important to maximizing the write margin.

Data is accessed from bit cell 205, during a read operation by precharging the two bit lines BL0 and BLN0 to a positive voltage, such as the positive power supply voltage Vdd, and placing a positive voltage $V_{WL}$ on the word line WL such that access transistors 225 and 230 allow storage nodes C0 and CN0 to be coupled to bit lines BL0 and BLN0 respectively. During the read operation bit cell 205 drives complementary read data signals onto the bit lines BL0 and BLN0, and a resulting read current pulls one of the two bitlines low in accordance with the stored state of the bit cell. The differential voltage on bit lines BL0 and BLN0 can be sensed using a differential sense amplifier (not shown) that senses and amplifies the differential voltage signal on the bit lines. The output of the sense amplifier is subsequently output as the read data for the bit cell.

Embodiments of bit cells using DDC transistors can have enhanced performance characteristics as compared to bit cells using conventional MOSFETs. Some of the reasons for the enhanced performance characteristics are (1) the DDC transistors can have lower threshold voltage variation, i.e., lower $\sigma V_T$, and (2) the DDC transistors have higher $I_{eff}$ and higher body coefficient. As a result, bit cells using DDC transistors can have (1) enhanced read stability that can be measured as enhanced read static noise margin, as well as lower SRAM minimum operating voltage $V_{DDmin}$; (2) enhanced write margin; (3) faster SRAM operation resulting from lower read current variability; and (4) lower bit cell leakage resulting from lower $\sigma V_T$.

Figure 3:
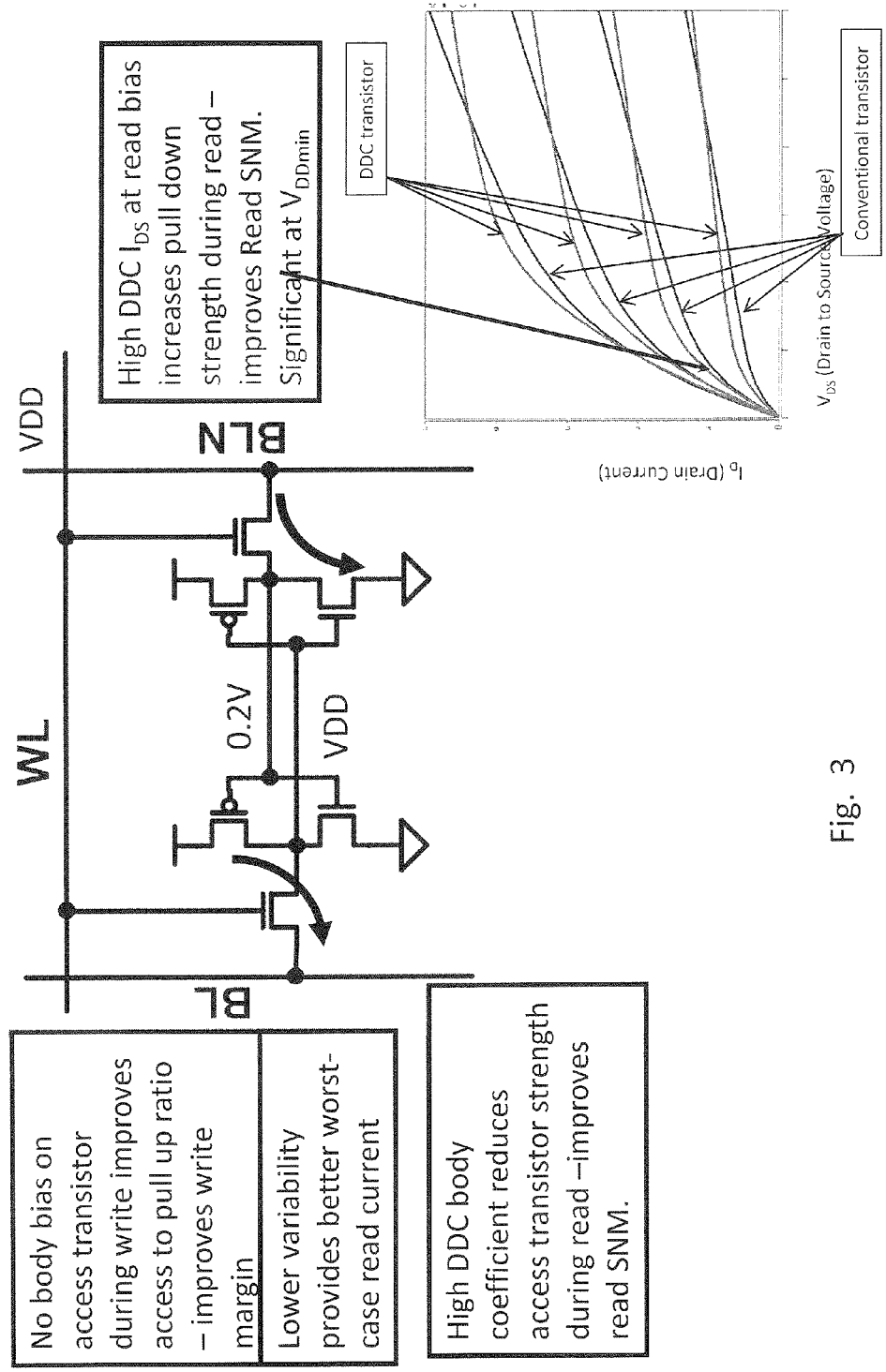
FIG. 3 shows a schematic representation of a static CMOS bit cell and a set of IDS vs. VDS curves reflecting the performance of the bit cell circuitry when implemented with conventional transistors versus being implemented with DDC transistors.

FIG. 3 shows an annotated bit cell that illustrates some of the advantageous DDC transistor characteristics. DDC transistors can exhibit a higher current drive as compared to conventional MOSFETs, when a low voltage is being applied to the gate and the drain-to-source voltage is less than $V_{GS}-V_T$ of the transistor, i.e., such that the transistor is operating in the linear region. This higher drive current is illustrated in the $I_D$ v. $V_{DS}$ graphs in FIG. 3 which show the drain current as a function of the drain voltage for a DDC transistor and a conventional transistor.

The source voltage on N-FETs of the cross-coupled CMOS inverters in the bit cell is increased during the read operation, diminishing the SNM. For example, this dynamic store low voltage $V_{CN}$ can be less than 0.2 V during the read operation in certain embodiments. This voltage can be as low as 0.1 volts in certain alternative embodiments. The amount of increase is a function of the ratio of the pull-down to access N-FET device, with the smallest possible increase (constrained by area) being desirable. Therefore, the higher drive current of DDC transistors at low drain biases contributes to an enhanced read SNM. Additionally, as the Vt's of the series N-FETs vary, the read SNM may be diminished. Therefore, the lower AVT of DDC transistors also improves read SNM.

During read operations, the N-FET access transistor of the bit cell has an increased body bias voltage that results from the rise in the storage node voltage during the read operation. Therefore, the enhanced body coefficient of the DDC transistor results in an N-FET access transistor with reduced drive current drive capability. The combination of the enhanced drive capability of the pull-down transistor, and the reduced drive capability of the access transistor results in an increased read SNM and increased cell stability. This is evident qualitatively from the better voltage divider ratio obtained by increasing the resistance through the access N-FET transistor and decreasing the resistance through the N-FET of the CMOS inverter, respectively.

FIG. 3 also shows that the bit cell using DDC transistors may not have a significant impact on the writeability of the bit cell when the bitline is driven to $V_{SS}$ because the access transistor has no body bias voltage under these conditions.

The enhanced body coefficient of the DDC transistor can also be used to provide bit cells having a lower standby power, and better column level margin controls.

Porting Methods

In one embodiment, a ported bit cell is generated based on a source bit cell. The source bit cell uses conventional FETs and is fabricated using a conventional semiconductor process, and the ported bit cell uses DDC transistors and is fabricated using a DDC semiconductor process. FIG. 4 illustrates a method to generate a ported bit cell based on the source bit cell, where the ported bit cell is designed to be a drop-in replacement for the source bit cell. In one embodiment, the ported bit cell can have the same area as the source bit cell, and each of the DDC transistors in the ported bit cell can have the same size as the corresponding transistor in the source bit cell. In alternative embodiments, the ported bit cell can be fabricated without making any modifications to the layout database (e.g., GDSII format) information corresponding to the source bit cell. In other embodiments, the ported bit cell can be fabricated using the same GDSII format information as the source bit cell. In some embodiments, the layout database information can be resized to produce the master or direct write information for the ported bit cell. For purposes of illustration only, the elements of these embodiments are described with reference to the flow charts shown in FIGS. 4-5. In some embodiments, the ported cell can be smaller and/or have dimensions and layout that make it more lithography friendly, i.e., easier to fabricate.

Figure 4A:
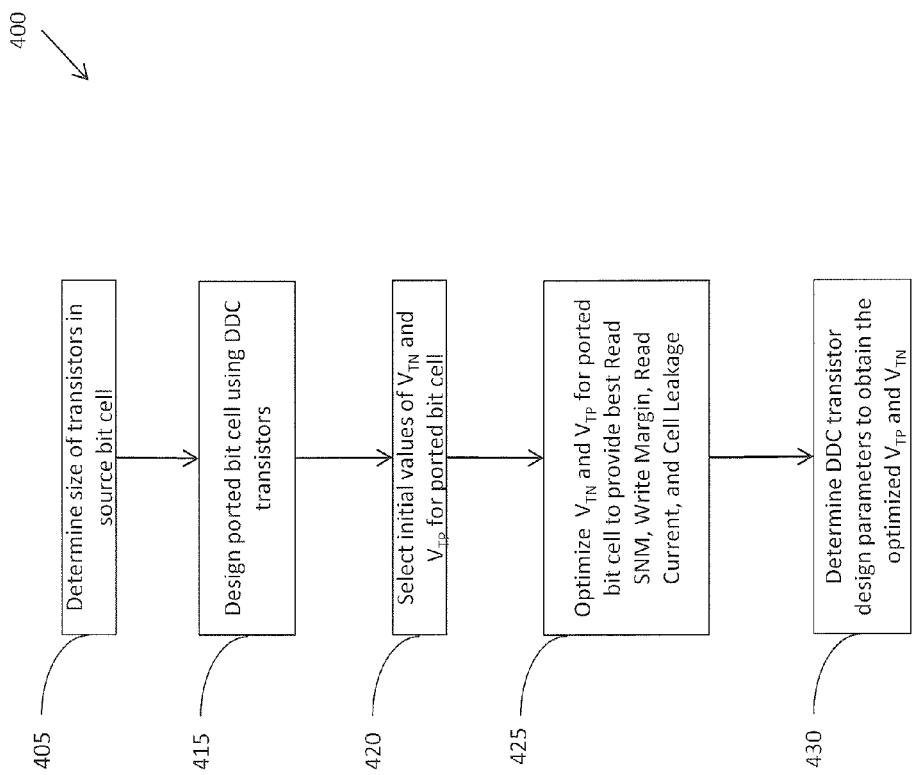
FIG. 4A is a flow diagram illustrating a process of porting a bit cell design from a first semiconductor manufacturing process to a second semiconductor manufacturing process.

Referring to FIG. 4A, a method 400 determines the gate width and gate length of the transistors in the source bit cell in step 405. In step 415, a ported bit cell is "designed" using one or more DDC transistors. In this context, "designed" refers to modifying a simulation model of original, or source, design, so that the simulation model will operate with DDC transistor models rather than conventional transistor models.

In one embodiment, the ported bit cell is a drop-in replacement for the source bit cell and uses DDC transistors of substantially the same size as the source bit cell. In alternative embodiments, the ported bit cell can be fabricated either using the layout database of the source bit cell with substantially no modifications, or it can be fabricated after resizing the layout database of the source bit cell. In step 420, initial values are selected for the DDC N-FET design parameters, commonly threshold voltage $V_{TN}$, and the DDC P-FET threshold voltage $V_{TP}$. It is noted that other design parameters such as junction leakage or drive current can be targeted. In this illustrative embodiment threshold voltage is used as the design target. In one embodiment, $V_{TN}$ and $V_{TP}$ are initially set to the threshold voltage used for logic gates on the same integrated circuit. In step 425, $V_{TN}$ and $V_{TP}$ are optimized to provide the best read SNM, write margin, read current, and cell leakage for the ported bit cell. It is noted that while read SNM, write margin, read current and cell leakage are typical design points for a bit cell, other design considerations such as target retention voltage (Vretain) can be utilized as a design point. Other design considerations such as Vwordline and other less common design points can also be utilized. In one embodiment, the ported bit cell $V_{TN}$ and $V_{TP}$ are selected to be substantially matched to the source bit cell. In one embodiment, an analysis is performed by simulating a ported bit cell having worst case mismatch between the DDC transistors in the cell. In one embodiment, the simulations are performed at a temperature that is considered to be the worst case operating temperature, e.g., 85° C. In certain embodiments, the simulations are performed under systematic process conditions, e.g., wafer to wafer variation, subject to an additional mismatch that would determine the worst case read SNM, worst case write margin, worst case read current, and worst case cell leakage of the ported bit cell. Step 425 optimizes $V_{TN}$ and $V_{TP}$ to provide the best values of these performance characteristics for the ported bit cell. For example, wafer to wafer variation can be included in the optimization step 425 by simulating at one or more process corners, such as fast N-FET slow P-FET, slow N-FET fast P-FET, slow N-FET slow P-FET, or fast N-FET fast P-FET. In step 430, DDC transistor design parameters required to obtain the optimized $V_{TN}$ and $V_{TP}$ (obtained in step 425) are determined. Such design parameters can include the thickness of the blanket epitaxial layer, the position of the screening region, the position of the threshold voltage tuning region, the dopant concentration of the screening region, and/or the dopant concentration of the threshold voltage tuning region.

Figure 4B:
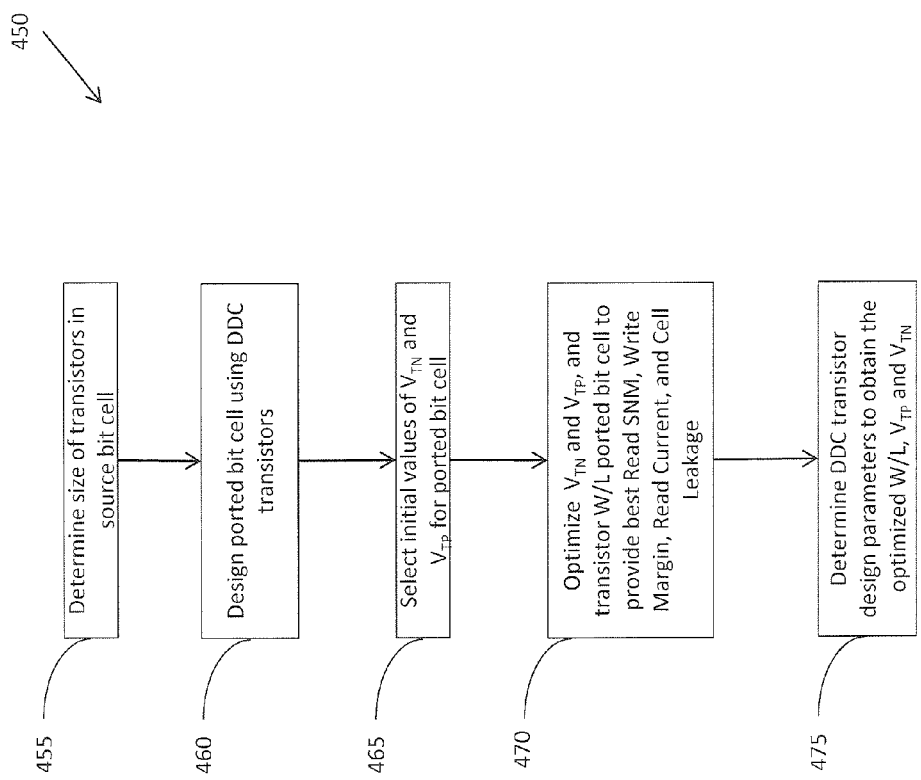
FIG. 4B is a flow diagram illustrating a process of porting a bit cell design from a first semiconductor manufacturing process to a second semiconductor manufacturing process.

FIG. 4B illustrates a method 450 to generate an optimized ported bit cell based on a source bit cell, where the ported bit cell is designed to be a drop-in replacement for the source bit cell. In a step 455, the sizes of the transistors in the source bit cell are determined. In a step 460, a ported bit cell is "designed" using one or more DDC transistors. In a step 465, initial values for design target parameters, in this embodiment N-FET threshold voltage and P-FET threshold voltage for the ported bit cell, are selected. It is noted that other design parameters such as junction leakage or drive current can be targeted. In this illustrative embodiment threshold voltage is used as the design target. In a step 470, the transistor gate-width and gate-length (W/L) is optimized, in addition to $V_{TN}$ and $V_{TP}$, to provide the best read SNM, write margin, read current, and cell leakage for the ported bit cell. It is noted that while read SNM, write margin, read current and cell leakage are typical design points for a bit cell, other design considerations such as target Vretain can be utilized as a design point. Other design considerations such as Vwordline and other less common design points can also be utilized. In certain embodiments, the optimization can change the transistor W/L for the ported bit cell in a limited range, e.g., a W/L change that can be accomplished by resizing the layout database information without resizing the overall cell. In a step 475, DDC transistor design parameters to obtain the optimized W/L for the optimized $V_{TN}$ and $V_{TP}$ (obtained in step 470) are determined.

Figure 4C:
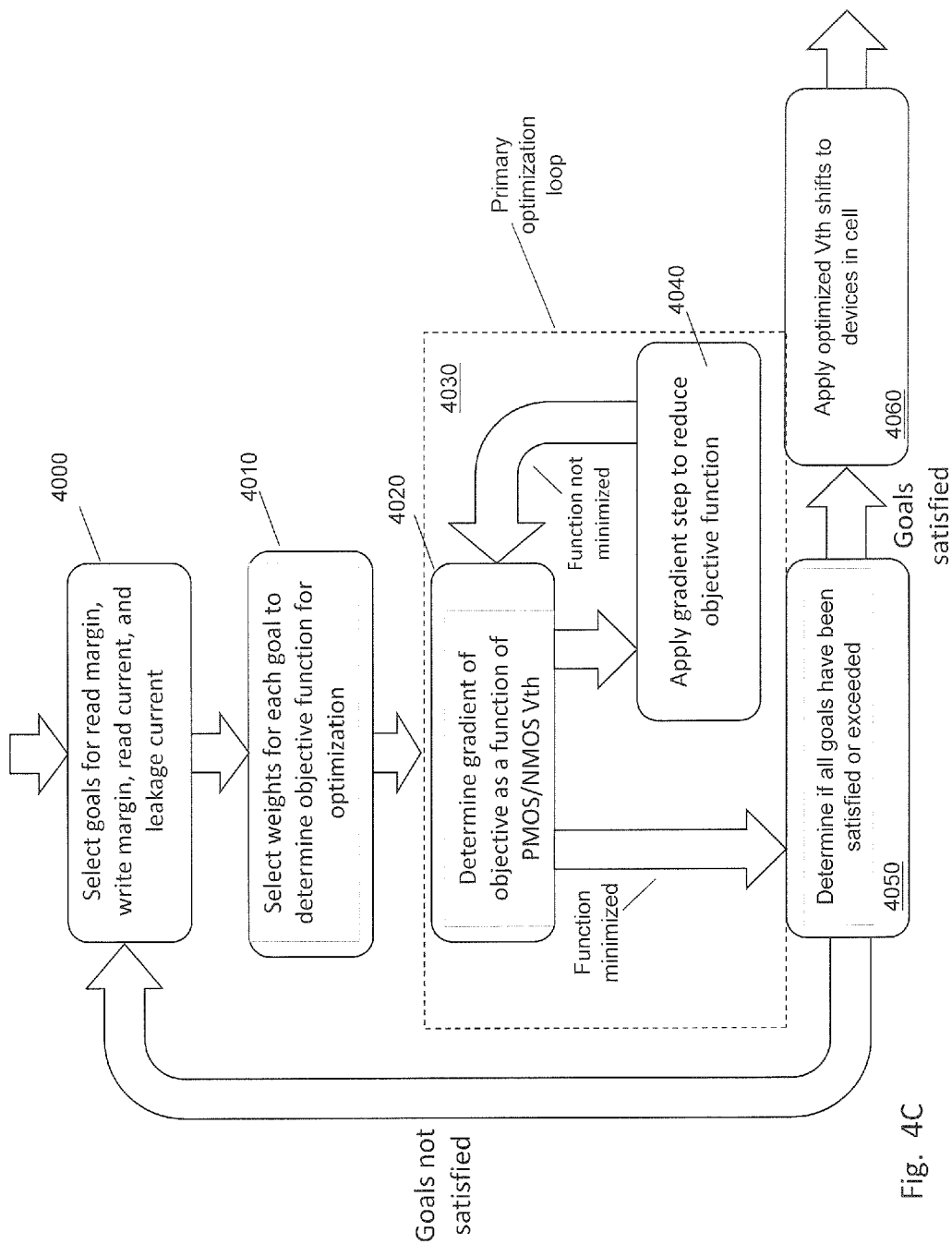
FIG. 4C is a flow diagram illustrating an optimization process for use in a method of porting a bit cell design from a first semiconductor manufacturing process to a second semiconductor manufacturing process.

FIG. 4C illustrates an embodiment of a method to generate a bit cell ported to contain at least one DDC device based on the non-DDC source bit cell, where the ported bit cell is designed to be a drop-in replacement for the source bit cell. Note that this method can be used for any type of devices (e.g., transistors) where there is a source bit cell designed to be fabricated in a first semiconductor process and a target bit cell for fabricating in a second semiconductor process different from the first semiconductor process, regardless of whether DDC transistors are used in the target bit cell. Though described in terms of threshold voltage as the parameter targets, the various embodiments can be implemented using other parameter targets such as junction leakage, drive current or other parameter. In a step 4000, the goals for read margin, write margin, read current and leakage current are identified. In a step 4010, weights for each of the read margin, write margin, read current and leakage currents are selected, in order to determine the objective function for a later optimization. In a step 4020, the gradient of the objective as a function of ratio of P-FET to N-FET Vt is determined. The porting is put through primary optimization loop 4030, whereupon matrix inversion techniques or other gradient-optimization methods are applied. If the objective function is not minimized, then in a step 4040 the gradient determination is performed to reduce the objective function. If the objective function is minimized, then in a step 4050 a check is performed to see if all goals for read margin, write margin, read current and leakage current have been satisfied or exceeded. If one or more goals have not been satisfied, then the porting goes back to step 4000. If all goals for read margin, write margin, read current and leakage current have been satisfied, then the Vt for each device are applied to the devices in the ported bit cell 4060. It is noted that while read SNM, write margin, read current and cell leakage are typical design points for a bit cell, other design considerations such as target Vretain can be utilized as a design point. Other design considerations such as Vwordline and other less common design points can also be utilized. Examples of the porting method are provided in FIGS. 4D and 4E.

Figure 4D:
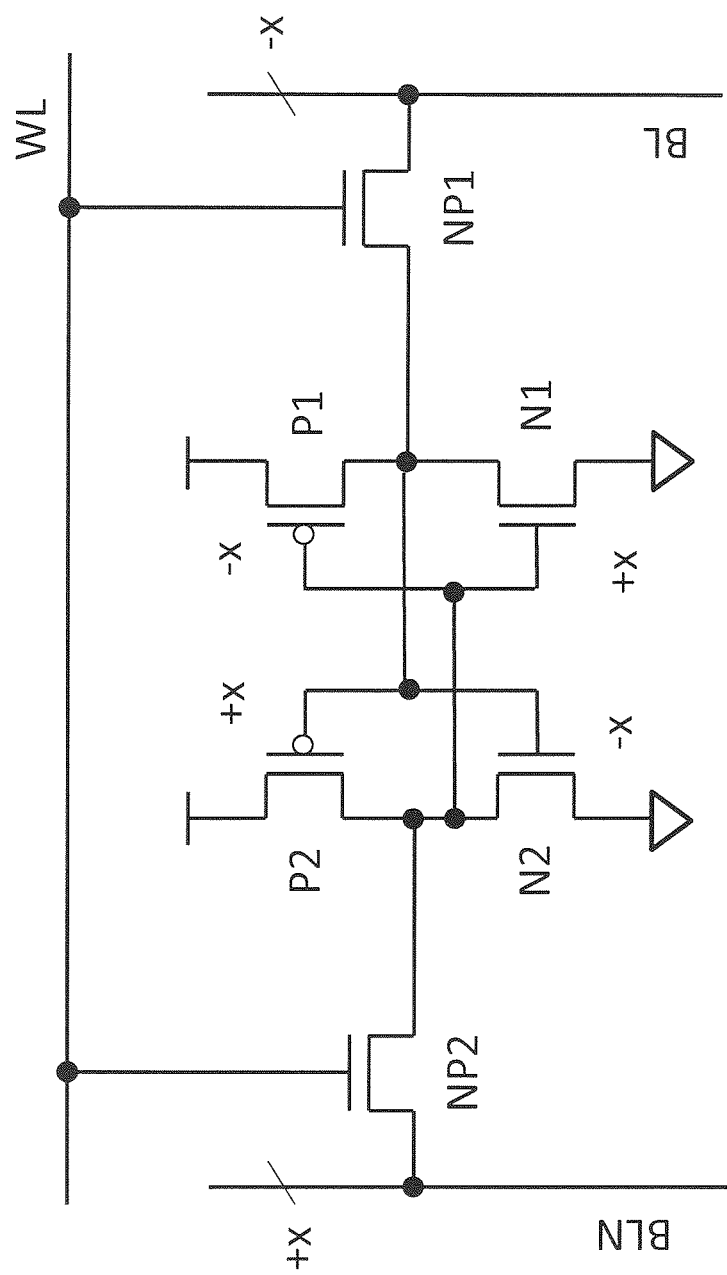
FIG. 4D illustrates the transistor mismatch used for worst case read Static Noise Margin ("SNM") simulations performed for an exemplary embodiment.

In FIG. 4D, an embodiment for determining the Vt shifts for a ported bit cell according to read margin goals is shown. The worst case read SNM is measured by generating a butterfly plot (not shown) for the ported bit cell, having a predetermined DDC threshold voltage variation of x sigma, where –x indicates faster, e.g., shorter channel or lower (absolute value) $V_t$ mismatch direction, while +x indicates the opposite. The simulations to measure the worst case read SNM are performed under the following conditions:

(1) A positive voltage is placed on bitlines BL0 and BLN0. In one embodiment, the positive voltage is the positive power supply voltage $V_{DD}$.

(2) A positive voltage is placed on the word line WL. In one embodiment, the positive voltage is the positive power supply voltage $V_{DD}$.

(3) For one of the CMOS inverters in the bit cell, i.e. for one side of the bit cell, the DDC N-FET has a +x sigma threshold voltage mismatch, and the DDC P-FET of the inverter has a –x sigma threshold voltage mismatch. For the other CMOS inverter in the bit cell, i.e., for the other side of the bit cell, the DDC N-FET has a –x sigma threshold voltage mismatch, and the DDC P-FET has a +x sigma threshold voltage mismatch. FIG. 4D illustrates the transistor mismatch used for worst case read SNM simulations performed for one embodiment.

(4) The DDC access transistor on the side of the cell that is driving its coupled bitline BL low has a –x sigma threshold voltage mismatch.

(5) The simulations are performed for the fast N-FET, slow P-FET corner. In certain embodiments, systematic process conditions, such as wafer to wafer variations, can also be taken into account by appropriately skewing the transistor mismatch parameters.

The butterfly plot generated under the above conditions can be asymmetric, i.e., one eye of the butterfly plot can be smaller than the other eye, because of the differences in the threshold voltages of the DDC transistors within the ported bit cell. The worst case read SNM is the width of the largest square that can fit in the smallest eye of the butterfly plot. In one embodiment, the read stability of the bit cell can be measured as the worst case read SNM. The simulations performed to determine the worst case read SNM is generally a DC analysis, however, the simulations can also be performed with a slow input ramped transient analysis.

Figure 4E:
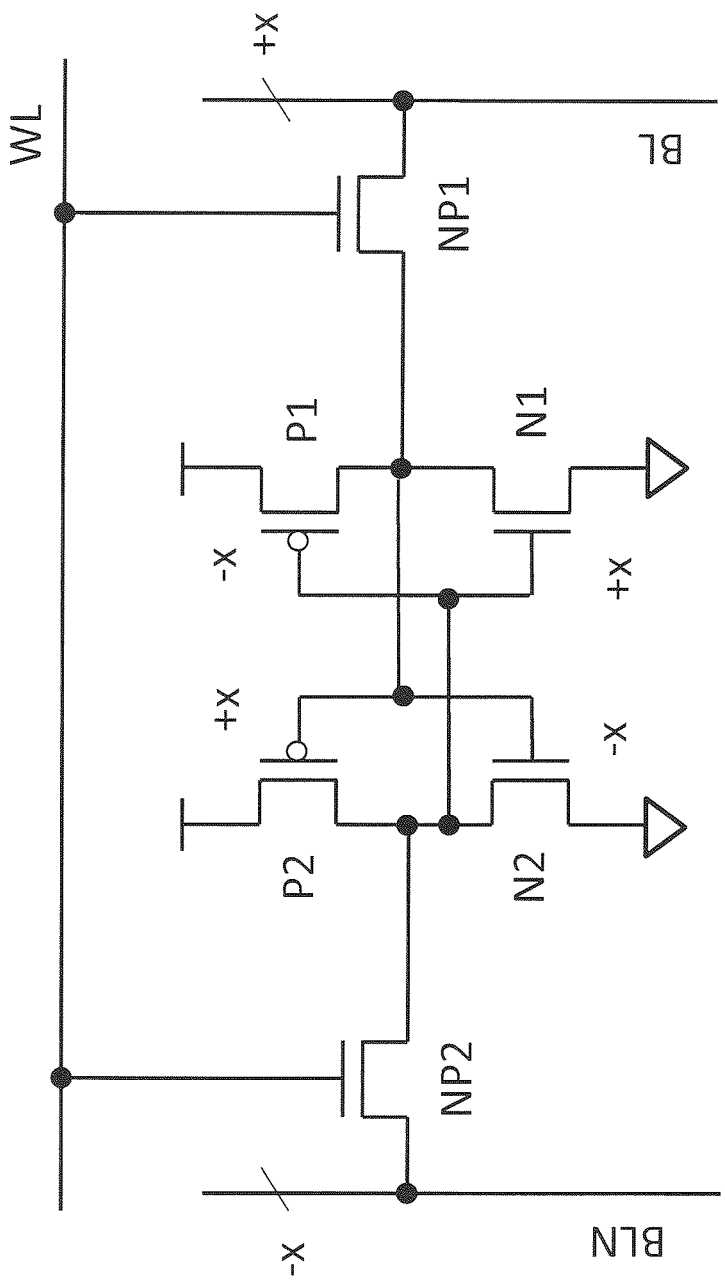
FIG. 4E illustrates the transistor mismatch used for worst case write margin simulations performed for an exemplary embodiment.

In FIG. 4E, an embodiment for determining the Vt shifts for a ported bit cell according to write margin goals is shown. In one embodiment, the worst case write margin is determined by performing simulations for the ported bit cell, having a predetermined DDC threshold voltage variation of x sigma, under the following conditions:

(1) A positive voltage is placed on the word line WL. In one embodiment, the positive voltage is the positive power supply voltage $V_{DD}$.

(2) A positive voltage is placed on bitline BL, and the voltage on bitline BL is swept from a high voltage, such as $V_{DD}$, to a low voltage, such as $V_{SS}$.

(3) The DDC N-FET access transistor, and the DDC N-FETs of the cross-coupled CMOS inverters have a +x sigma threshold voltage mismatch. The DDC P-FETs of the cross-coupled CMOS inverters have a –x sigma threshold voltage mismatch, on the side being measured. FIG. 4E shows the mismatch used for worst case write margin simulations performed for one embodiment. Other transistors may be skewed as shown in the figure, or not, or by a lesser amount.

(4) The simulations are performed for the slow N-FET, fast P-FET corner. In some embodiments, systematic process conditions, such as wafer-to-wafer variations, can also be taken into account by appropriately skewing the transistor mismatch parameters.

The word line voltage at which the bit line voltage flips is the worst case write margin for the ported bit cell. In one embodiment, the worst case write margin is required to be greater than zero by a predetermined amount. Since the determination of the write margin requires determining the effect of the feedback behavior in the bit cell, a transient circuit simulation can be the most accurate way of determining the write margin, however, by determining the appropriate voltage on the node being pulled low by the bitline, a DC analysis can also be used.

In one embodiment, the read current is determined by performing simulations for the ported bit cell, where the ported bit cell having a predetermined DDC transistor threshold voltage variation of x sigma, under the following conditions:

The DDC N-FETs have a +x sigma threshold voltage mismatch, and the DDC Ps have a +x sigma threshold voltage mismatch.

(1) Simulations are performed for the slow N-FET, slow P-FET process corner. In some embodiments, systematic process conditions, such as wafer-to-wafer variations, can also be taken into account by appropriately skewing the transistor mismatch parameters.

In one embodiment, the read current is determined during the transient bitline development, when both bitlines BL and BLN are precharged to a high voltage, e.g., $V_{DD}$, and word line WL is subsequently set to a high voltage, e.g., $V_{DD}$. Under these conditions, either bitline BL or BLN is discharged to a low voltage through the DDC N-FET of the CMOS inverter and the access transistor connecting the bitline to $V_{SS}$, depending on whether the stored state in the ported bit cell is a "0" or "1" respectively. The read current for the ported bit cell is determined when the bitline that is discharging is transitioning from the precharged high voltage state to the low voltage. In an alternative embodiment, the read current can be determined at DC by storing a "0" in the ported bit cell, applying a high voltage to bitline BL and word line WL, and measuring the current through the DDC N-FET of the CMOS inverter. In some embodiments, the ported bit cell bitlines BL and BLN are connected to a sense amplifier used by the SRAM when the read current is measured because the read current for the same bit cell can be different when it is connected to different sense amplifiers.

In one embodiment, bit cell leakage is measured by performing simulations at the fast N-FET, fast P-FET process corner. In some embodiments, systematic process conditions, such as wafer to wafer variations, can also be taken into account by appropriately skewing the transistor mismatch parameters.

In some embodiments, read SNM and write margin can be the two key parameters that affect the optimization of $V_{TN}$ and $V_{TP}$. The response of both read SNM and write margin can be dominated by two of the transistors in the bit cell. For read SNM the strength ratio of the N-FET access transistor to the pull-down transistor (e.g., NP1 to N1 or NP2 to N2) dominates the response. Alternatively, for write margin the strength ratio of the N-FET access transistor to the pull-up transistor (e.g., NP1 to P1 or NP2 to P2) dominates the response. Therefore, for performing the read SNM analysis, high variability for these two transistors (e.g., either the NP1

N1 pair or the NP2 N2 pair), along with lower variability for the remaining four transistors in the bit cell such that the total response adds up to a particular total cell level variation or 'sigma' at the cell level can provide a definitive analysis or optimization point for the SRAM cell. For example if "a" represents the variation of the two transistors that dominate the response of the read SNM, and if "b" represents the variation of the remaining four transistors, then "a" and "b" can be related by the following equations for 1 sigma total (cell) variability:

$$1 = \text{sqrt}(2*a^2 + 4*b^2);$$

$$1 = (2*a^2 + 4*b^2);$$

$$b = \text{sqrt}(1 - 2*a^2)/2;$$

In the above equations, if the variation "b" is zero, then the "a" variation is $1/\sqrt{2}$. As a result, in certain embodiments, the maximum "a" variation, subject to the constraint that the total cell variation is "1", is $1/\sqrt{2}$. In alternative embodiments, the maximum a variation can be higher as increased cell variation is permitted (i.e., the cell sigma is increased). For example, if the cell sigma is "2", then the maximum a variation is "1", i.e., a is less than or equal to "1". By working with 1 sigma, the resulting values can be linearly scaled for other sigma levels.

In some embodiments, a similar analysis can be performed for the write margin. The write margin response is dominated by the ratio of the DDC N-FET access transistor to the DDC P-FET of the CMOS inverter (i.e., P1 to NP1 or P2 to NP2). Therefore, for performing the write margin analysis, high variability for these two transistors (e.g., either the P1 NP1 pair or the P2 NP2 pair), along with lower variability for the remaining four transistors in the bit cell such that the total response adds up to one sigma at the cell level can provide a definitive analysis or optimization point for the bit cell. Thus, the variation a determined from the above equations is applied to these two transistors (i.e., either P1 NP1 or P2 NP2, as determined by the initial state of the bit cell which the write must overpower), and the variation b is applied to the remaining four transistors.

This analysis of the bounds of the devices may be extended to the overall cell response 2 sigma, 3 sigma, and so on responses, with the bounds of the other devices impacted as evident by the primary two devices that dominate the response. Thus, more accurate estimations of the bounds of the cell response at various mismatch levels may be determined.

In alternative embodiments, the optimization of the bit cell can also take into account different variability for different DDC transistors in the bit cell. In some embodiments, the optimization of the bit cell can also take into account variations resulting from systematic process corners on bit cell performance, i.e., the impact on read SNM at the fast N-FET slow P-FET corner, the impact on write margin at the slow N-FET fast P-FET corner, the impact on read current at the fast N-FET fast P-FET corner, and the impact on cell leakage at the fast N-FET fast P-FET corner.

Figure 5:
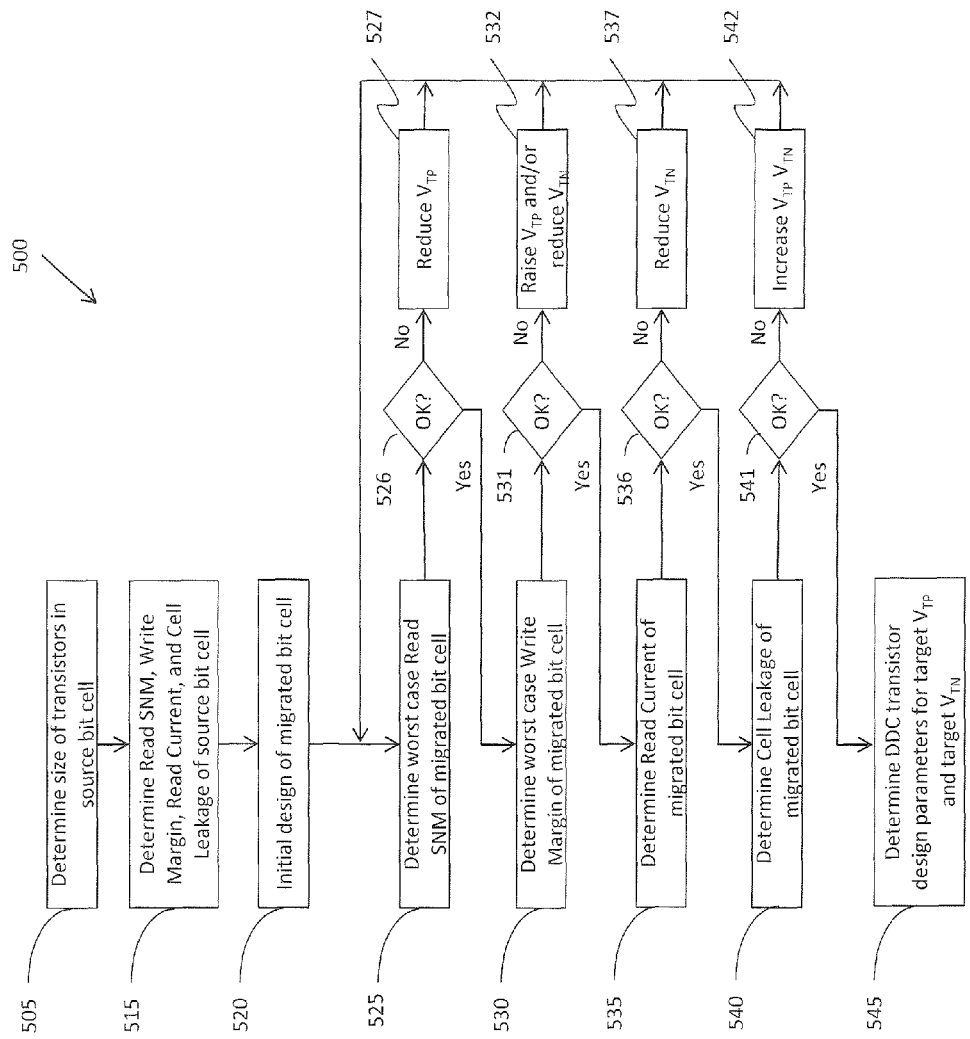
FIG. 5 is a flow chart illustrating a method of generating an optimized ported bit cell based on a source bit cell, where the ported bit cell is to be a drop-in replacement for the source bit cell.

FIG. 5 shows a flow chart illustrating a method 500 to target a ported bit cell to match the device matching characteristics of a source bit cell. The advantage such a using DDC transistors in the ported bit cell is that the W/L for the DDC transistors can be reduced for otherwise the same performance characteristics. In a step 505, the sizes of the transistors in the source bit cell are identified. In a step 515, the read SNM, write margin, read current and cell leakage of the source bit cell are determined. In a step 520, the initial design of the ported bit cell is performed. In a step 525, the worst case read SNM of the ported bit cell is determined. In a step 526 a decision is made, so that if the read SNM of the ported bit cell matches, then the matching can proceed to another parameter, shown here as a step 530 which is the worst case write margin for the ported bit cell. If the read SNM of the ported bit cell does not match, then P-FET Vt is reduced 527 and the determination of worst case read SNM of the ported bit cell at 525 is performed again. After a step 530, a decision is made in a step 531, so that if the write margin of the ported bit cell matches, then the matching can proceed to another parameter, shown here as a step 535 which is the read current for the ported bit cell. If the write margin of the ported bit cell does not match, then either the P-FET Vt is raised or N-FET Vt is reduced or both are done at a step 532, whereupon the loop goes back to the first step of the parameter determinations for the ported bit cells, which here is the read SNM 525. At a step 535, the read current of the ported bit cell is determined. After step 535, a decision is made at a step 536, so that if the read current of the ported bit cell matches, then the method proceeds to the next parameter, which here is at a step 540 which determines the cell leakage of the ported bit cell. If the read current of the ported bit cell does not match, then the N-FET Vt is reduced 537, whereupon the loop goes back to the first step of the parameter determinations for the ported bit cells, which here is read SNM 525. At step 540, the cell leakage of the ported bit cell is determined. After step 540, a decision is made at a step 541, so that if the cell leakage of the ported bit cell matches, then the method proceeds to the last step which is that the DDC transistor design parameters for the matched target P-FET Vt and N-FET Vts are determined. If the cell leakage of the ported bit cell does not match, then both P-FET Vt and N-FET Vt are increased 542, whereupon the loop goes back to the first step of the parameter determinations for the ported bit cell which here is read SNM 525. At a step 545, the transistors are matched, and the DDC transistor design parameters for fabricating in silicon for the target P-FET Vt and N-FET Vt are determined.

Figure 6:
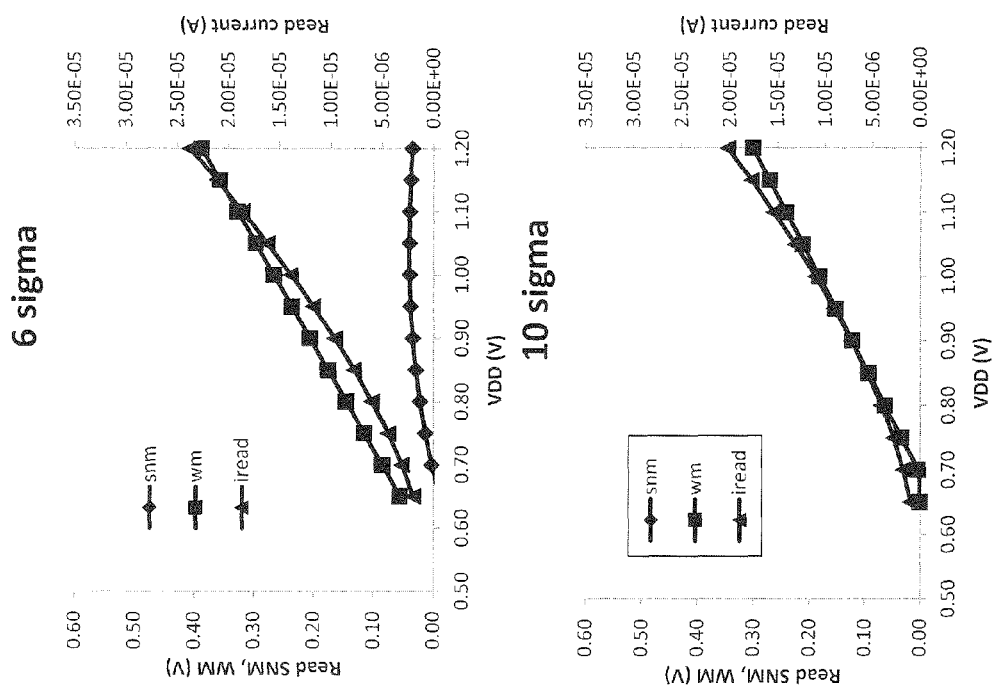
FIG. 6 shows graphs of read SNM, read current, and write margin obtained from simulations performed for a bit cell using conventional transistors with halo implants for a 65 nm process.

FIG. 6 shows graphs of read SNM, read current, and write margin obtained from simulations performed for a bit cell using conventional transistors with halo implants for a 65 nm process. The bit cell was designed to operate at a target power supply voltage ($V_{DD}$) of 1.2V. The read SNM graph corresponding to 6σ mismatch shows that the bit cell has a $V_{DDmin}$ of 0.7 V, i.e., the lowest value of $V_{DD}$ at which the SRAM can operate (has sufficient read SNM, read current, and write margin) is approximately 0.7V. The read SNM graph corresponding to 10σ mismatch shows that the bit cell does not have a positive read SNM at any value of $V_{DD}$. Therefore, 6σ is the mismatch required to provide yield to relatively small SRAM arrays, assuming no other systematic process differences.

Figure 7:
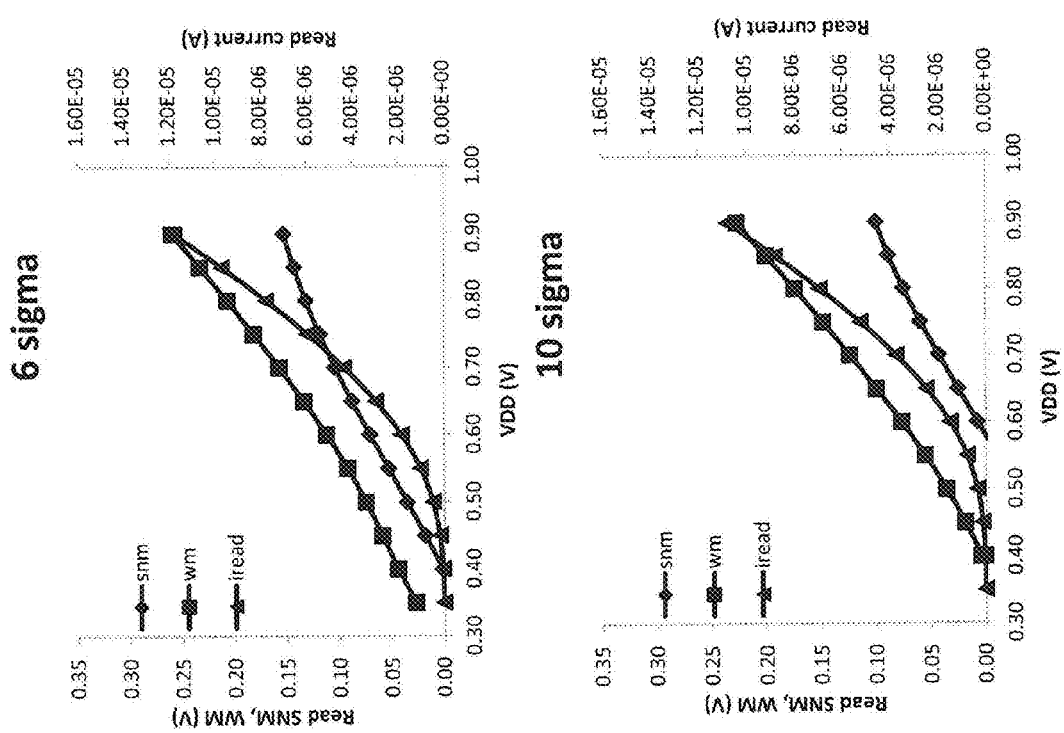
FIG. 7 shows graphs of read SNM, read current, and write margin obtained from simulations performed for a bit cell using DDC transistors for a 65 nm process.

FIG. 7 shows graphs of read SNM, read current, and write margin obtained from simulations performed for a bit cell using DDC transistors for a 65 nm process. The DDC transistors of the bit cell simulated for FIG. 7 have the same gate width and gate length as the corresponding transistors (i.e., the conventional transistors with halo implants) for the bit cell simulated for FIG. 6. The DDC threshold voltages for the bit cell were optimized in accordance with one of the methods described above. The bit cell of FIG. 7 was designed to operate at a target power supply voltage ($V_{DD}$) of 0.7V. The read SNM graph corresponding to 6σ shows that the bit cell has a $V_{DDmin}$ of 0.4 V, i.e., the lowest value of $V_{DD}$ at which the SRAM can operate (has a positive read SNM) is approximately 0.4V. The read SNM graph corresponding to 10σ shows that the bit cell has a $V_{DDmin}$ of 0.6V, i.e., the bit cell has sufficient read SNM, read current, and write margin down to a power supply voltage of 0.6V. FIGS. 6-7 illustrate that a ported bit cell using DDC transistors can have a lower $V_{DDmin}$ and acceptable yield for larger SRAM arrays at a given voltage as compared to a source bit cell using conventional transistors with halo implants where both bit cells use transistors of the same W/L and the ported bit cell has transistors with optimized $V_{TP}$ and $V_{TN}$.

Figure 11:
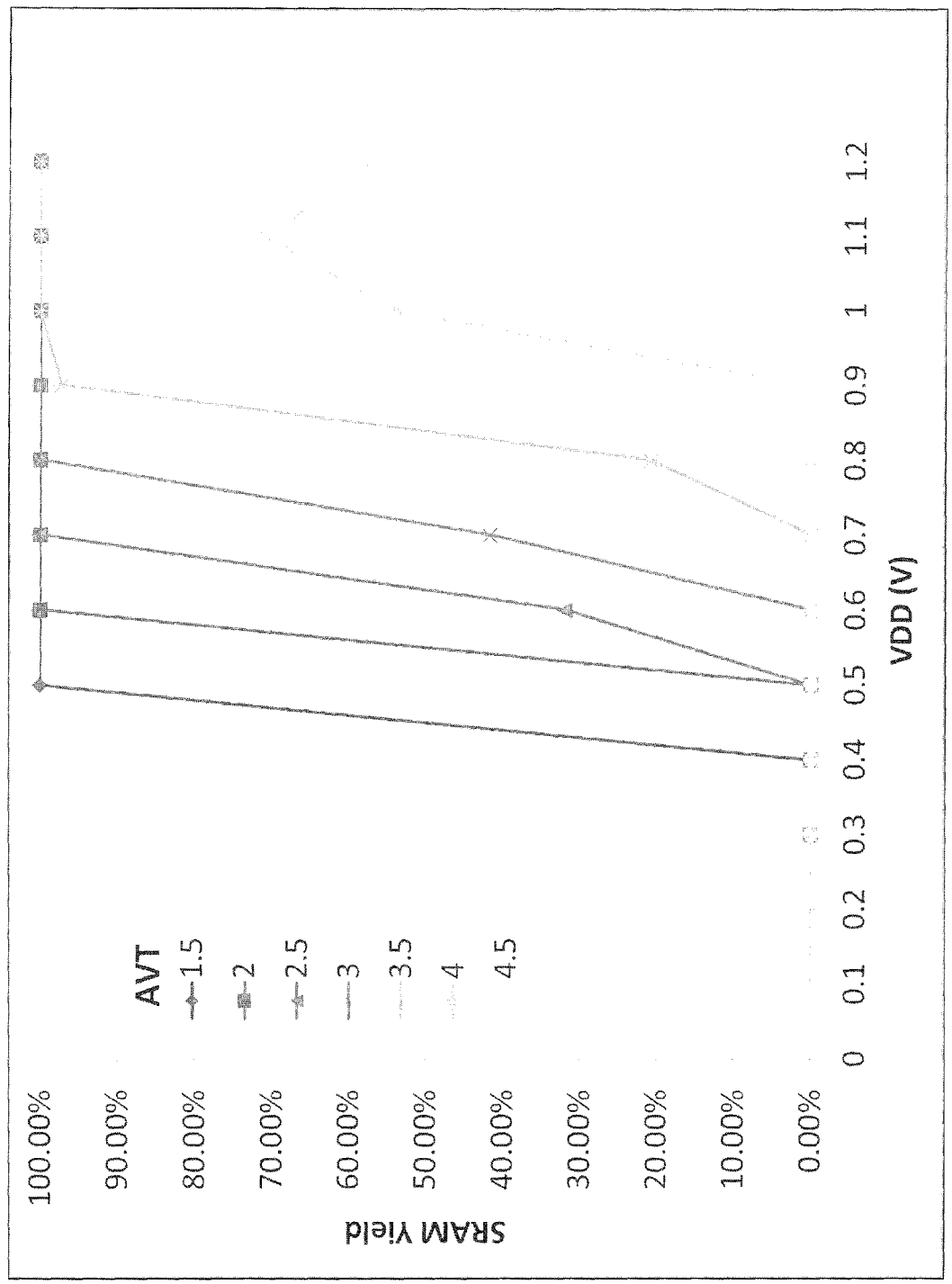
FIG. 11A shows yield as a function of $V_{DD}$ and AVT in the presence of process drift for an SRAM having bit cells using DDC transistors.
FIG. 11B shows yield as a function of $V_{DD}$ and AVT in the presence of process drift for an SRAM having bit cells using DDC transistors.
FIG. 11C shows yield as a function of $V_{DD}$ and AVT with no drift in the process mean assumed, for an SRAM having bit cells using DDC transistors.
FIG. 11D shows yield as a function of $V_{DD}$ and AVT with no drift in the process mean assumed, for an SRAM having bit cells using DDC transistors.
Figure 11B:
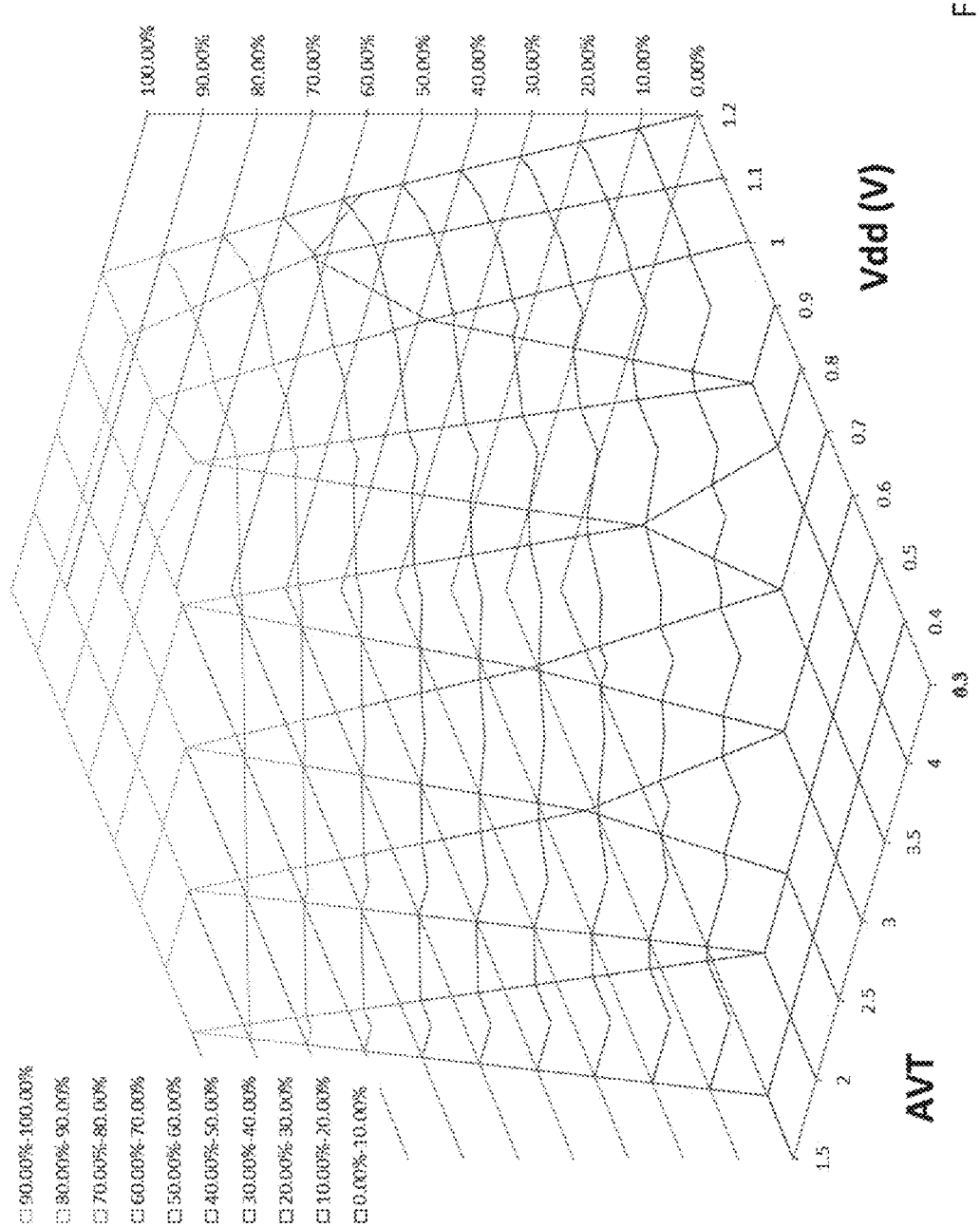
Figure 11C:
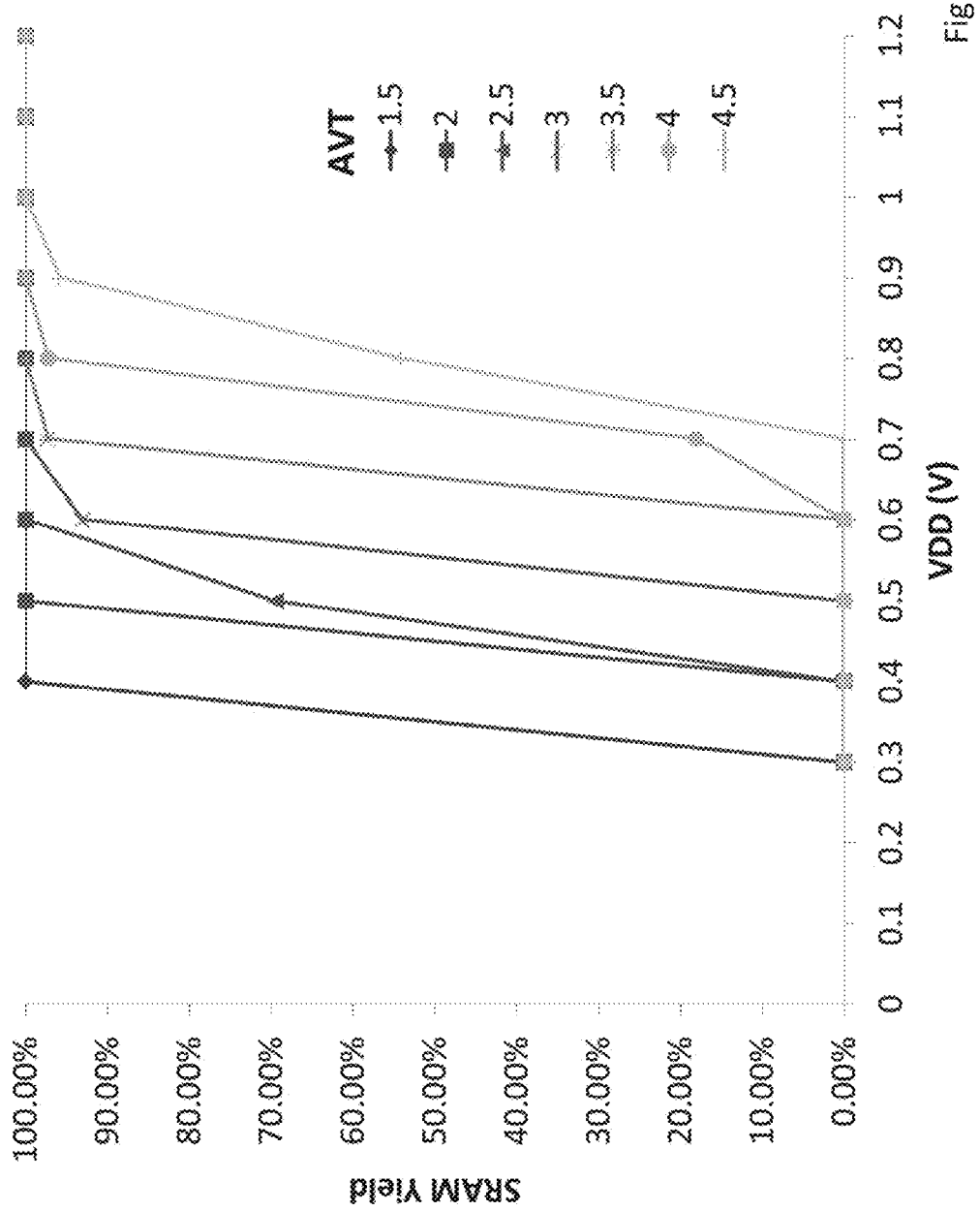
Figure 11D:
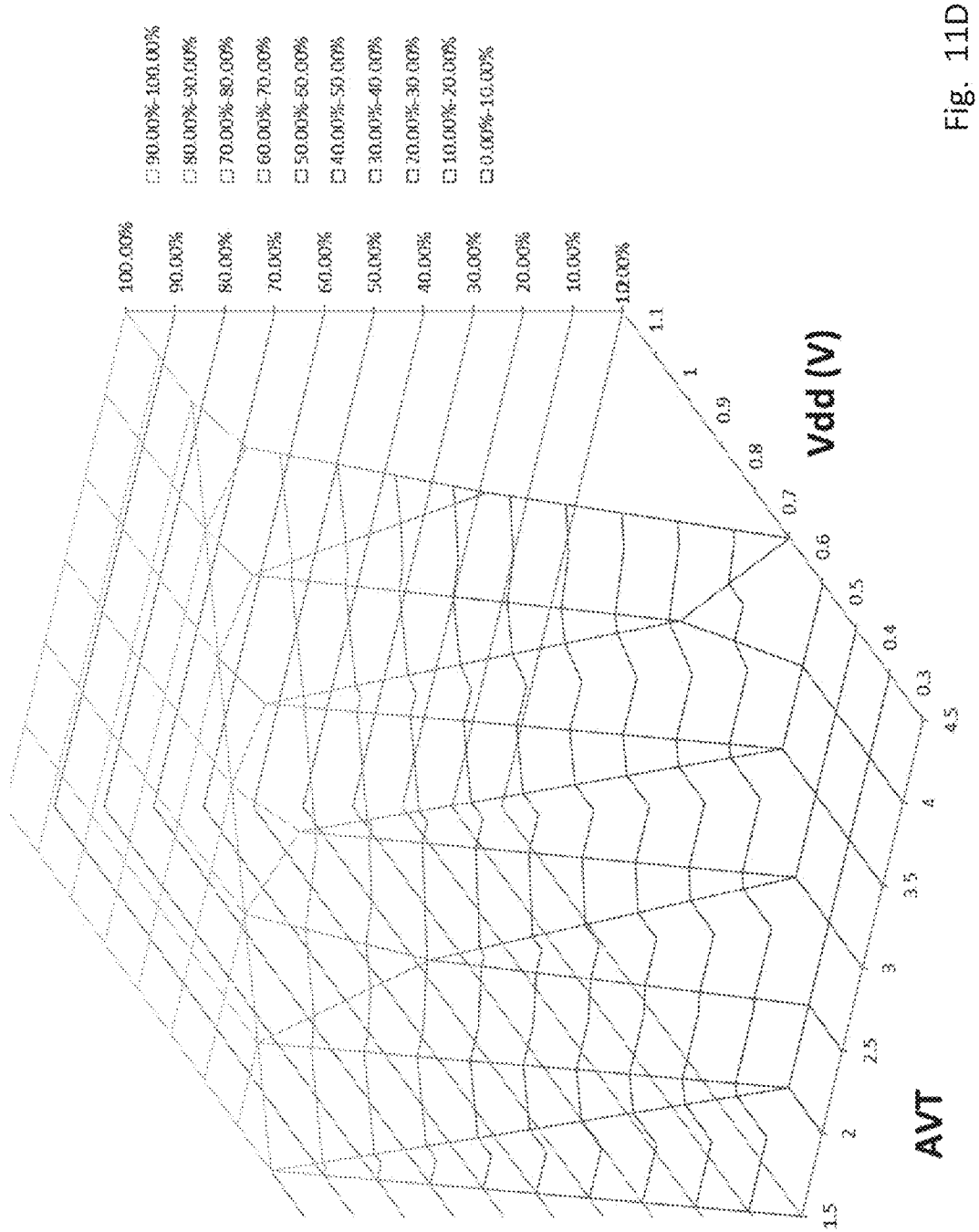

FIGS. 11A-11B show SRAM yield as a function of $V_{DD}$ and AVT in the presence of process drift, for an SRAM using DDC transistors. FIGS. 11C-11D show SRAM yield as a function of $V_{DD}$ and AVT with no drift in the process mean assumed, for an SRAM using DDC transistors. It is observed from FIGS. 11A-11D that the improved characteristics of DDC transistors can result in a bit cell with a low $V_{DDmin}$. In addition, a DDC transistor based bit cell can have a lower $V_{DDmin}$ as compared to a conventional bit cell.

Figure 8:
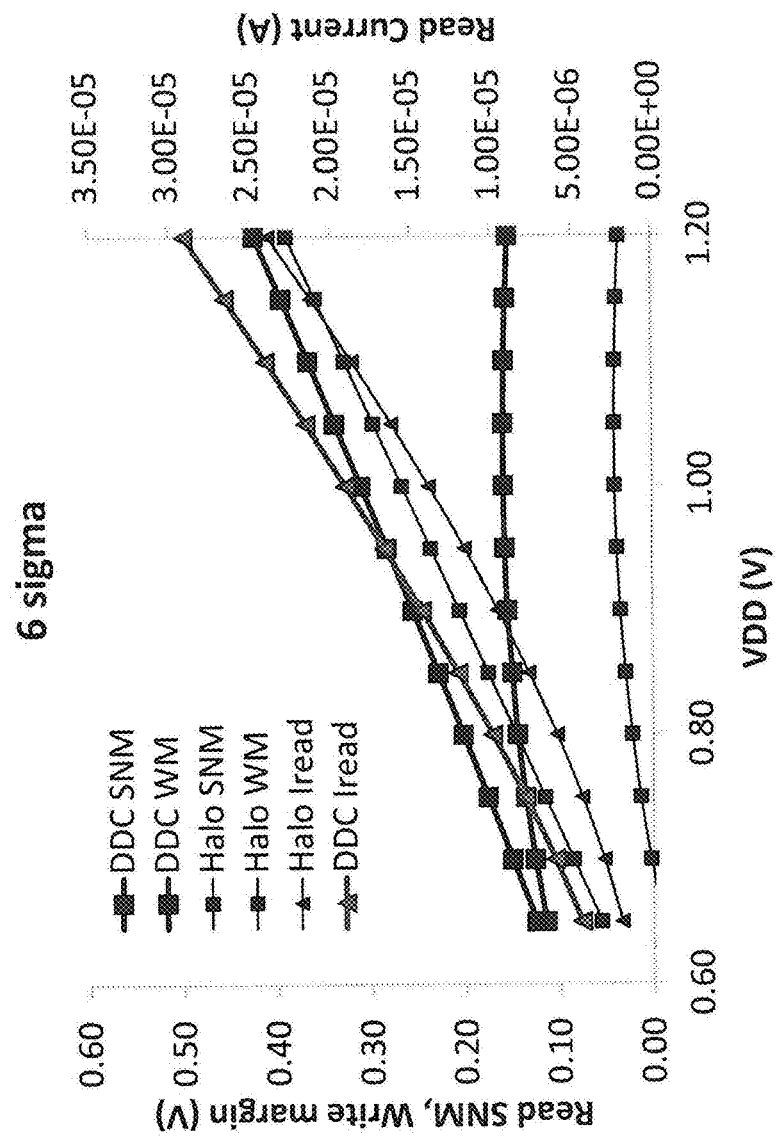
FIG. 8 shows graphs of the read SNM, write margin, and read current for a bit cell using DDC transistors and a bit cell using conventional transistors with halo implants.

FIG. 8 shows graphs of the read SNM, write margin, and read current for a bit cell using DDC transistors and a bit cell using conventional transistors with halo implants. Both bit cells use transistors of the same size. Put another way, the DDC bit cell is a drop-in replacement for the conventional transistor based bit cell, and both bit cells use a 65 nm fabrication process in this exemplary embodiment. FIG. 8 shows that the DDC transistor based bit cell has a higher read SNM, a higher write margin, and a higher read current (resulting is faster SRAMs), and therefore has better performance characteristics for all values of $V_{DD}$ where the cell is operational. In addition, the $V_{DDmin}$ of the DDC transistor based bit cell is 0.4V, whereas the $V_{DDmin}$ of the conventional transistor based SRAM cell is 0.7V.

Figure 9:
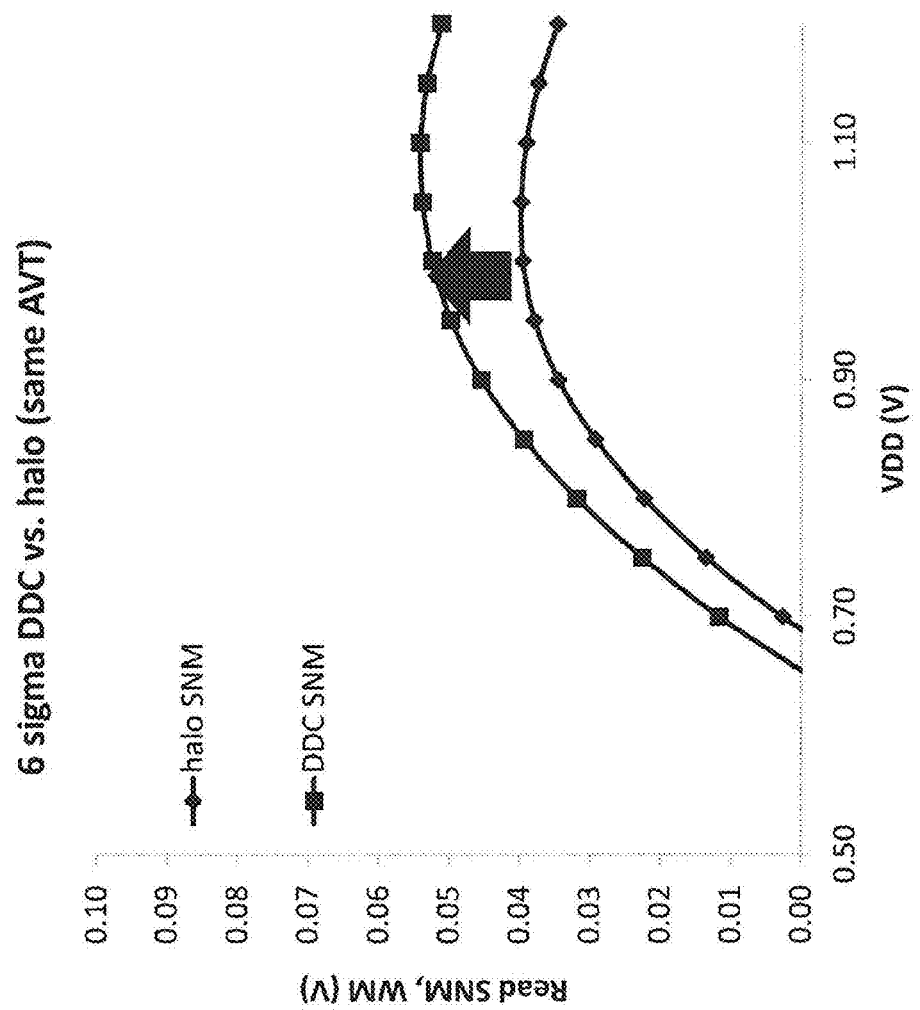
FIG. 9 shows graphs of read SNM and write margin for an SRAM cell using EBE transistors and an SRAM cell using conventional transistors for simulations performed at 6σ and the same AVT.

FIG. 9 shows graphs of read SNM and write margin for an SRAM cell using DDC transistors and a bit cell using conventional transistors for simulations performed at 6σ and the same AVT. The AVT used for these simulations is the AVT of a baseline process using conventional transistor with halo implants. The DDC transistor based bit cell has a higher read SNM as compared to the conventional transistor based bit cell because the enhanced body coefficient of the DDC transistor provides higher read SNM independent of AVT. The improved current characteristic of the DDC transistor can also contribute to the higher read SNM, but usually to a lesser extent. FIG. 9 also illustrates that the $V_{DDmin}$ corresponding to the read SNM is lower for DDC transistor based bit cell as compared to a conventional transistor based bit cell with substantially similar sized transistors.

Figure 10A:
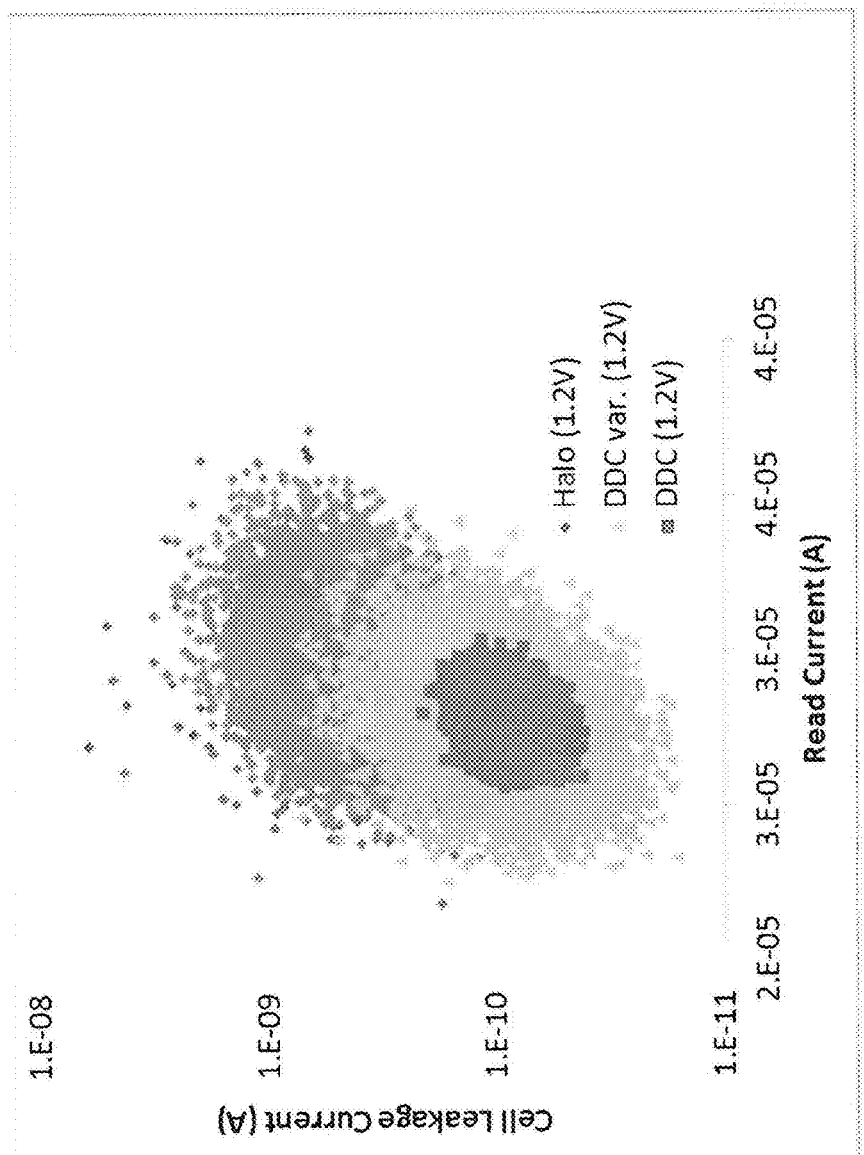
FIG. 10A shows cell leakage versus read current obtained from Monte Carlo simulations performed for a bit cell using DDC transistors and for a bit cell using conventional transistors.
Figure 10B:
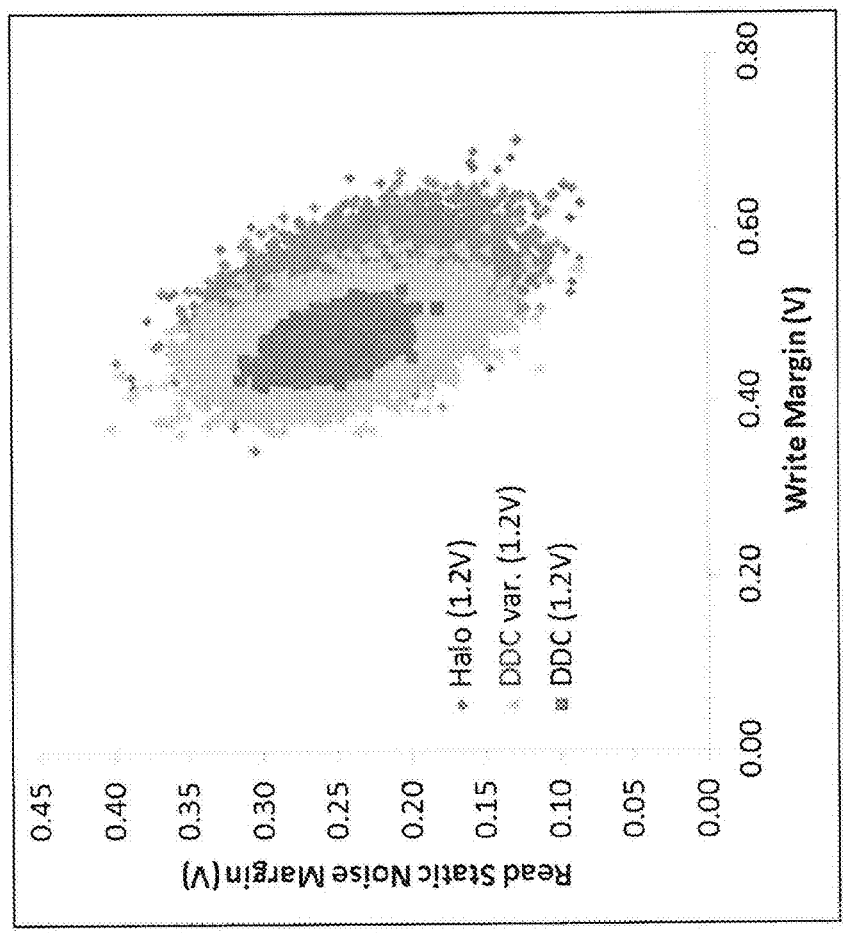
FIG. 10B shows read SNM versus write margin obtained from Monte Carlo simulations performed for a bit cell using DDC transistors and for a bit cell using conventional transistors.

FIGS. 10A-10B show cell leakage, read current, read SNM and write margin, obtained from Monte Carlo simulations performed for a bit cell using DDC transistors and a bit cell using conventional transistors. These figures show that the bit cell using DDC transistors has a tighter distribution of cell leakage, read current, read SNM and write margin as compared to the bit cell using conventional transistors. The distribution indicated in red corresponds to a bit cell using DDC transistors that have a better AVT. The distribution indicated in green corresponds to a bit cell using DDC transistors that has the same AVT as the bit cell using conventional transistors. These figures show that the bit cell using DDC transistors has a tighter distribution of cell leakage, read current, read SNM and write margin when the DDC transistors have a better AVT, as well as when the DDC transistors have the same AVT as compared to the bit cell using conventional transistors.

The various methods for optimizing the bit cell can be used to set the transistor W/L and/or the threshold voltages $V_{TP}$ and $V_{TN}$ for the transistors used in the ported bit cell to maximize the margins. In one embodiment, the transistor sizes are modified during the optimization process such that no layout database changes are required, i.e., the transistor size changes are made within a range that can be obtained be performing an optional layout database resizing. In one embodiment, circuit simulation can be used to optimize the W/L, $V_{TP}$, and/or $V_{TN}$ of the constituent transistors of the bit cell. In one embodiment, a built-in optimization provided by the circuit simulation program can be used, and a predetermined objective function can be defined to optimize the W/L, $V_{TP}$, and/or $V_{TN}$ of the constituent transistors of the bit cell. In alternative embodiments, other optimization methods can be used, such as Simplex, or geometric programming. In one embodiment, weights are assigned to each of the SRAM performance characteristics that are to be optimized (such as read SNM, write margin, read current, and cell leakage), and an optimization is performed to optimize the W/L, $V_{TP}$, and/or $V_{TN}$ of the constituent transistors of the bit cell.

Advantageously, a characteristic of DDC transistors is a reduced mismatch as compared to conventional FETs. The reduced mismatch allows for pulling in of design corners and greater flexibility in design. The characteristics of the DDC transistor allow for the response of the DDC transistor in a wider range to a change in the body bias voltage applied to the screening region. More specifically, the enhanced body coefficient of the DDC transistor can allow a broad range of ON-current and the OFF-current that depends on the body bias voltage applied to the screening region, as compared to the body bias voltage applied to a conventional device. In addition, the DDC transistors have a lower $\sigma V_T$ than conventional devices. The lower $\sigma V_T$ allows for a lower minimum operating voltage $V_{DD}$ and a wider range of available nominal values of $V_T$. The enhanced body coefficient of the DDC transistor can also allow a broad range of threshold voltage that depends on the body bias voltage applied to the screening region, as compared to the body bias voltage applied to a conventional device. The screening region allows effective body biasing for enhanced control of the operating conditions of a device or a group of devices to be set by controlling the applied body bias voltage. In addition, different operating conditions can be set for devices or groups of devices as a result of applying different body bias voltages.

One illustrative method of transforming a first set of transistor electrical parameter targets of transistors in a circuit designed to be implemented in a first semiconductor manufacturing process to a second set of transistor electrical parameter targets for that circuit in a second semiconductor manufacturing process to obtain equal or better performance of the circuit when the circuit is implemented in the second semiconductor manufacturing process as compared to being implemented in the first semiconductor manufacturing process, includes a) obtaining a first set of performance constraints for the circuit implemented in the first semiconductor manufacturing process; b) providing a plurality of sets of transistor model parameters; c) associating transistor model parameters from a first set of the plurality of sets of transistor model parameters with each of the transistors models in a simulation representation of the circuit; d) determining whether the simulation representation of the circuit at least meets the performance constraints; and e) assigning, if the determination of step (d) is affirmative, the associated transistor model parameters as transistor electrical parameter targets for each transistor of the circuit that is to be implemented in the second semiconductor manufacturing process; wherein each of the plurality of sets of transistor model parameters is associated with one or more physical structures produced by the second semiconductor manufacturing process. In another embodiment, the method includes associating, if the determination of step (d) is negative, transistor model parameters from a second set of the plurality of sets of transistor model parameters with each of the transistor models in the simulation representation of the circuit; and then g) repeating steps (d) and (e).

In typical embodiments, the first set of transistor parameter targets includes a first set of threshold voltage targets, and the second set of transistor parameter targets includes a second set of threshold voltage targets. In various embodiments, a set of timing constraints is associated with the circuit; and equal or better performance includes at least meeting all the timing constraints of the set of timing constraints. In some embodiments, equal or better performance further includes having lower leakage current in the circuit, where the leakage current is due to off-state leakage current arising from short-channel effects.

In various embodiments, the first semiconductor manufacturing process provides transistors only of the legacy type structure; and the second semiconductor manufacturing process provides transistors of at least the DDC type transistor structure. It is noted that the transistors of the DDC type include P-FETs and N-FETs.

In various embodiments, obtaining the first set of performance constraints comprises simulating the circuit model of the circuit using the first set of transistor electrical parameter targets as transistor model parameters.

In another embodiment, a method of porting a static memory bit cell from a first semiconductor process to a second semiconductor process, includes receiving a layout for the static memory bit cell; obtaining a first set of performance constraints for the static memory bit cell implemented in the first semiconductor process; determining yield targets as a function of power supply voltage for the static memory bit cell; providing a plurality of sets of transistor model parameters; associating transistor model parameters from a first set of the plurality of sets of transistor model parameters with each of the transistor models in a simulation representation of the static memory bit cell; determining whether the simulation representation of the static memory bit cell at least meets the performance constraints; and assigning, if the determination is affirmative, the associated transistor model parameters as transistor electrical parameter targets for each transistor of the static memory bit cell that is to be implemented in the second semiconductor manufacturing process; wherein each of the plurality of sets of transistor model parameters is associated with one or more physical structures produced by the second semiconductor process.

In another embodiment, a method of porting an integrated circuit design from a first process to a second process, includes a) determining the sizes of transistors in a source bit cell; b) determining read static noise margin, write margin, read current, and cell leakage of the source bit cell; c) producing an initial simulation model of a ported bit cell by modifying the simulation model of source bit cell so that an initial set of DDC transistor models replace the original transistor models of the source bit cell; d) determining whether a worst case read static noise margin of the simulation model of the ported bit cell is within a first predetermined constraint; e) reducing, if the determination of step (d) negative, $V_{TP}$ and returning to step (d); f) determining whether a worst case write margin of the simulation model of the ported bit cell is within a second predetermined constraint; g) increasing $V_{TP}$ and/or reducing $V_{TN}$ and returning to step (d); h) determining whether a read current of the simulation model of the ported bit cell is within a third predetermined constraint; i) reducing, if the determination of step (h) is negative, $V_{TN}$ and returning to step (d); j) determining whether a cell leakage of the simulation model of the ported bit cell is within a fourth predetermined constraint; k) increasing, if the determination of step (j) is negative, $V_{TP}$ and $V_{TN}$; and l) determining the DDC transistor process parameters to achieve the targeted $V_{TP}$ and $V_{TN}$.

It is noted that selectively doping the DDC transistors may further include a step of using a mask pattern that is designed based upon the optimized width and length of the DDC transistors.

CONCLUSION

It is to be appreciated that the Detailed Description section, and not the Abstract of the Disclosure, is intended to be used to interpret the Claims. The Abstract of the Disclosure may set forth one or more, but not all, illustrative embodiments of the invention, and thus, is not intended to limit the invention or the subjoined Claims in any way.

The exemplary embodiments described herein are provided for illustrative purposes, and are not limiting. Other embodiments are possible, and modifications may be made to the exemplary embodiments within the spirit and scope of the invention. Therefore, the Detailed Description is not meant to limit the invention. Rather, the scope of the invention is defined only in accordance with the subjoined Claims and their equivalents.

It is to be understood that the phraseology or terminology herein is for the purpose of description and not of limitation, such that the terminology or phraseology of the present specification is to be interpreted by those skilled in relevant art(s) in light of the teachings herein.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. A method of fabricating an integrated circuit comprising:
    producing a second transistor circuit design based on a first transistor circuit design, the second transistor circuit design having target transistors, the target transistors including a plurality of deeply depleted channel (DDC) transistors, the second design having an initial threshold voltage value assigned to each of the target transistors;
    determining targets defining a set of design constraints;
    solving objective functions with the set of design constraints to produce optimized threshold voltage values for each of the target transistors;
    selectively doping a semiconductor substrate to form a plurality of highly-doped screening regions over which a corresponding plurality of transistor gates will respectively be formed;
    selectively doping the semiconductor substrate in regions that are associated with the target transistors to dopant concentrations that set the threshold voltage values for each of the target transistors to a desired range of values; and
    forming an undoped semiconductor layer above the highly doped screening region.

2. The method of claim 1, wherein the first transistor circuit design is a bit cell and the second transistor circuit design is a bit cell.

3. The method of claim 1, wherein the target transistors of the second transistor circuit design each have a gate length and a gate width; and further comprising:
determining targets for the gate length and gate width of the target transistors of the second transistor circuit design.

4. The method of claim 3, wherein the optimized the threshold voltage values for each of the target transistors comprises an optimized gate length or an optimized gate width for each of the DDC transistors.

5. The method of claim 4, wherein selectively doping the target transistors comprises using a mask pattern that is designed based upon the optimized gate length or the optimized gate width the of each of the DDC transistors.

6. The method of claim 2, wherein the bit cell is a six-transistor static random access memory (SRAM) cell.

7. The method of claim 1, wherein forming an undoped semiconductor layer comprises growing an epitaxial layer.

8. The method of claim 1, wherein at least one of the plurality of DDC transistors is an n-channel transistor.

9. The method of claim 1, wherein at least one of the plurality of DDC transistors is a p-channel transistor.

10. The method of claim 1, further comprising forming source/drain extension regions above the highly-doped screening region.

11. An integrated circuit structure comprising:
a plurality of target transistors configured in a second transistor circuit design based on a first transistor circuit design, the plurality of target transistors including a plurality of deeply depleted channel (DDC) transistors, the second transistor circuit design having an initial threshold voltage value assigned to each one of the plurality of target transistors;

wherein the each target transistor of the plurality of target transistors has a functional target defined by a set of design constraints, and the initial threshold voltage value is specified by a solution of objective functions within the design constraints;

a semiconductor substrate having a plurality of highly-doped screening regions each one under a corresponding one of a plurality of target transistor gates;

a portion of the plurality of highly-doped screening regions further comprising doped regions configured to set the threshold voltage value for each of the target transistors;

an undoped semiconductor layer formed above the highly doped screening region.

12. The structure of claim 11, wherein the first and the second transistor circuit designs are memory bit cells.

13. The structure of claim 12, wherein the first and the second transistor circuit designs are static random access memory (SRAM) cells.

14. The structure of claim 13, wherein the memory bit cell is a six-transistor SRAM cell.

15. The structure of claim 11, wherein the undoped semiconductor layer comprises an epitaxial layer.

16. The structure of claim 11, wherein at least one of the plurality of DDC transistors is an n-channel transistor.

17. The structure of claim 11, wherein at least one of the plurality of DDC transistors is a p-channel transistor.

18. The structure of claim 11, further comprising source/drain extension regions above the highly-doped screening region.

* * * * *